(12) United States Patent
Sakai et al.

(10) Patent No.: US 6,168,665 B1
(45) Date of Patent: Jan. 2, 2001

(54) SUBSTRATE PROCESSING APPARATUS

(75) Inventors: Mitsuhiro Sakai, Kumamoto-ken; Kiyohisa Tateyama; Kimio Motoda, both of Kumamoto, all of (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/185,503

(22) Filed: Nov. 4, 1998

(30) Foreign Application Priority Data

Nov. 5, 1997 (JP) ...................................... 9-303136
Dec. 15, 1997 (JP) ...................................... 9-345320

(51) Int. Cl.⁷ .............................. B05C 21/00; B05C 11/00
(52) U.S. Cl. ............................................. 118/500; 118/506
(58) Field of Search ..................................... 118/506, 733, 118/500; 294/12; 220/819, 264, 582, 345.1

(56) References Cited

U.S. PATENT DOCUMENTS 3,563,158 * 2/1971 Omer ....................................... 99/326
5,695,817    12/1997 Tateyama et al. .
5,718,763     2/1998 Tateyama et al. .
6,050,446 *   4/2000 Lei et al. ............................. 220/819

* cited by examiner

Primary Examiner—Laura Edwards
Assistant Examiner—George R. Koch, III
(74) Attorney, Agent, or Firm—Oblon, Spivak, McClelland, Maier & Neustadt, P.C.

(57) ABSTRACT

A substrate processing apparatus comprising a substrate mounting table, a cup having an upper opening and surrounding the substrate mounting table, a lid for opening/closing the upper opening of the cup, a support arm for supporting the lid, a first lifting mechanism having a first piston for supporting the support arm directly or indirectly and a first cylinder for guiding the first piston in an up-and-down motion, a second lifting mechanism having a second piston for supporting the support arm directly or indirectly and a second cylinder for guiding the second piston in up-and -down motion, a driving circuit for supplying the pressurized fluid to the first and second cylinders, independently and exhausting the pressurized fluid from the first and second cylinders, independently, and a control mechanism for controlling operations of the driving circuit.

9 Claims, 19 Drawing Sheets

SUBSTRATE PROCESSING APPARATUS

BACKGROUND OF THE INVENTION

The present invention relates to a substrate processing apparatus comprising a cup and a lid which define a processing space for processing a large substrate such as a glass substrate for a liquid crystal display (LCD).

In an LCD manufacturing process, similarly in a manufacturing process for a semiconductor device, a photolithographic technology is employed. In the LCD photolithographic process, a resist coating film is formed on a glass substrate, and then subjected to pattern exposure and development. Thereafter, a semiconductor layer, an insulating layer and an electrode layer formed on the substrate are selectively etched to form an ITO (Indium Tin Oxide) thin film and an electrode pattern.

A resist solution is coated on the LCD substrate by use of a so-called spin-coating method, for example, disclosed in U.S. Pat. No. 5,688,322. Operation using coating apparatus of this type is performed as follows: First, a lid is opened and a substrate is loaded into a cup. While the substrate is adsorbed and held by a spin chuck, a solvent and a resist solution are poured dropwise onto the surface of the substrate. After the lid is closed, the substrate is rotated by the spin chuck. Then, the lid is opened and the substrate is unloaded from the cup. Finally the lid is closed.

The lid is supported at one side by a support arm which is movable up and down by an air cylinder mechanism. In a conventionally employed apparatus, the maximum stroke amount required for lifting the lid from the cup, is equal to that of the cylinder. Therefore, the distance between the lid and the cup is short, with the result that a sufficient space cannot be ensured for cleaning the inside of the cup. To clean the inside of the cup, the lid and the support arm must be removed from the apparatus main body every time. However, it is inconvenient to remove them from the main apparatus.

In addition, because the lid and the support arm are large and heavy, it is difficult to handle them. When they are removed from and attached to the apparatus main body, they may possibly hit the cup and its accessories and destroy them. Furthermore, an excessive load is imposed on the air cylinder mechanism when the lid is lifted, so that machine trouble frequently takes place. Therefore the conventional apparatus is short in lift. On the other hand, when the lid is moved down, it takes too much time to exhaust the inner air from the cylinder, with the result that the throughput is low.

BRIEF SUMMARY OF THE INVENTION

An object of the present invention is to provide a substrate processing apparatus capable of opening and closing a lid during the substrate processing time and performing operation simple and securely without taking the apparatus apart during the maintenance operation time.

According to the present invention, there is provided a substrate processing apparatus comprising a substrate mounting table;

a cup having an upper opening and surrounding the substrate mounting table;

a lid for opening/closing the upper opening of the cup;

a support arm for supporting the lid;

a first lifting mechanism having a first piston for supporting the support arm directly or indirectly and a first cylinder for guiding the first piston in an up-and-down motion;

a second lifting mechanism having a second piston for supporting the support arm directly or indirectly and a second cylinder for guiding the second piston in up-and-down motion;

a driving circuit for supplying the pressurized fluid to the first and second cylinders, independently and exhausting the pressurized fluid from the first and second cylinders, independently; and a control mechanism for controlling operations of the driving circuit.

According to the present invention, there is provided a substrate processing apparatus comprising a substrate mounting table;

a cup having an upper opening and surrounding the substrate mounting table;

a lid for opening/closing the upper opening of the cup;

a support arm for supporting the lid;

a cylinder mechanism having a piston for transmitting a driving force for moving the support arm up and down, to the support arm;

an upper pulley set at a position higher than an upper dead point of the piston of the cylinder mechanism a lower pulley set at a position lower than the upper pulley;

an endless belt stretching between the upper and lower pulleys to one side of which said support arm is fastened; and a weight fastened to the other side of the endless belt so as to keep a balance of the support arm and the lid.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferred embodiments of the present invention will be described with reference to the accompanying drawings.

Figure 1:
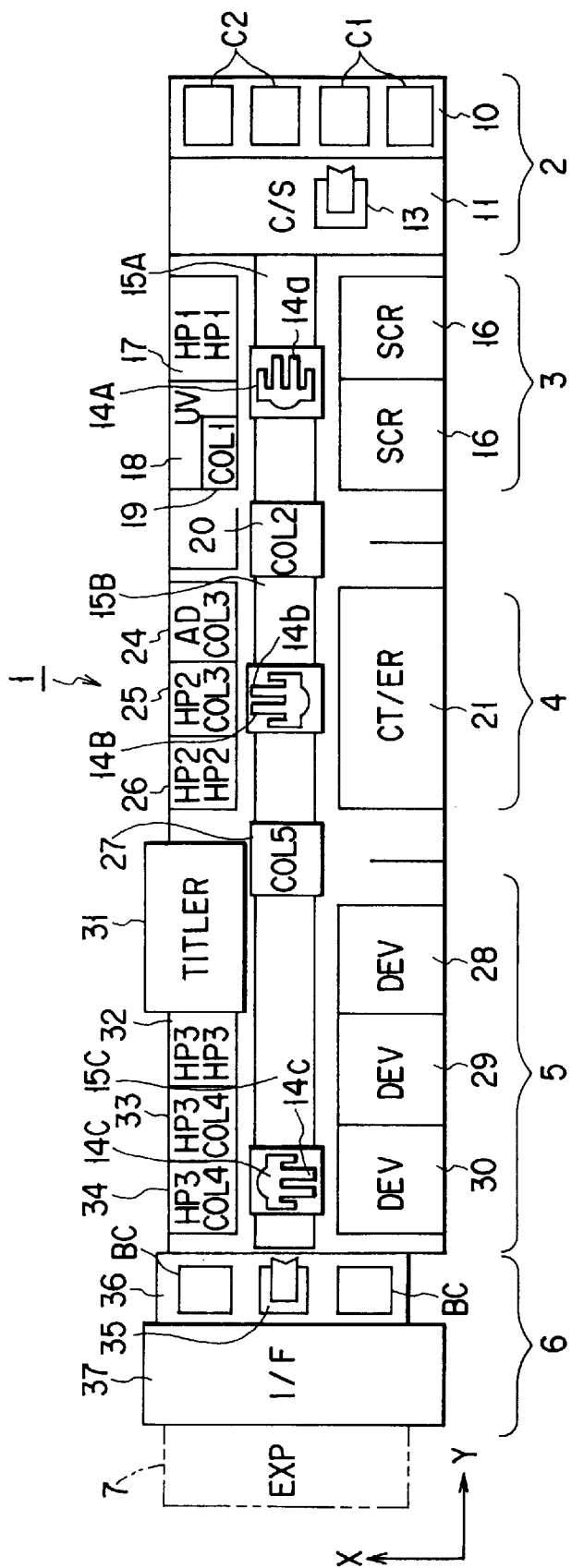
FIG. 1 is a schematic plan layout showing an LCD substrate processing system.
Figure 2:
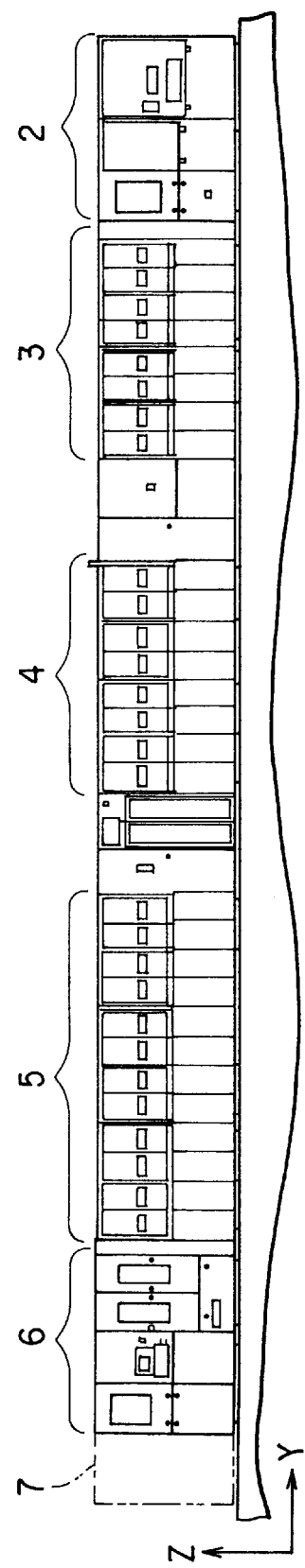
FIG. 2 is a schematic front outlook showing an LCD substrate processing system.

As shown in FIGS. 1 and 2, a coating/developing processing system 1 has a loader/unloader section 2, a first processing section 3, a second processing section 4, a third processing section 5, and an interface section 6. The processing system 1 has various processing mechanisms for coating a photoresist solution onto an LCD substrate G and developing the resist coating film. The processing system 1 is connected to a light-exposure apparatus 7 with an interface section 6 interposed between them.

The loader/unloader section 2 has a cassette table 10 and a transportation section 11, each extending in an X-axis direction. On the cassette table 10, at most four cassettes C1, C2 are mounted side by side. Unprocessed LCD substrates G are stored in two cassettes C1 and processed LCD substrates G are stored in the other two cassettes C2. For example, 25 LCD substrates G at maximum can be stored in each of the cassettes C1 and C2.

In the transportation section 11, a first sub arm mechanism 13 is provided. The first sub-arm mechanism 13 has a holder for loading/unloading the substrate G into the cassettes C1 and C2, a back and forth moving mechanism for moving the holder back and forth, an X-axis moving mechanism for moving the holder in the X-axis direction, a Z-axis moving mechanism for moving the holder in the Z-axis direction, and a θ rotation mechanism for rotating the holder about the Z-axis in a swinging manner.

The first processing section 3 has a central transportation passage 15A extending in the Y-axis direction, a first main arm mechanism 14A movably provided along the transportation passage 15A, and a plurality of units 16, 17, 18, 19. Two wet-washing units 16 are arranged along one side of the transportation passage 15A. The wet-wash unit 16 has a brush scrubber SCR for scrub-washing the surface of the substrate G with a rotating brush while poring a washing solution to the substrate G. Along the other side of the transportation passage 15A, a heating unit 17, a dry-washing unit 18 and a cooling unit 19 are arranged. The heating unit 17 has a two-stage (upper and lower stage) hot plate HP1 for heating the substrate G. The dry washing unit 18 has an ultraviolet washing apparatus UV for washing the surface of the substrate G by irradiating ultraviolet rays to the substrate G. The cooling unit 19 has a cooling plate COL1 for cooling the substrate G. A first main arm mechanism 14A has a holder 14a for holding the substrate G, a back and forth moving mechanism for moving the holder 14a back and forth, an Y-axis moving mechanism for moving the holder 14a back and forth, a Z-axis moving mechanism for moving the holder 14a back and forth, and a θ-rotation mechanism for rotating the holder 14a about the Z-axis in a swinging mechanism.

The second processing section 4 has a central transportation passage 15B extending in the Y-axis direction, a second main arm mechanism 14B movably provided along the transportation passage 15B, and a plurality of processing units 21, 24, 25, 26. A resist coating/peripheral resist removing unit 21 is arranged along one of the sides of the transportation passage 15B. The unit 21 has a coating apparatus CT for coating the resist solution onto the substrate G while spin-rotating the substrate G and a peripheral resist removing apparatus ER for removing a resist coating film from the peripheral portion of the substrate G. An adhesion/cooling unit 24, a heating/cooling unit 25, and a heating/heating unit 26 are arranged along the other side of the transportation passage 15B. The adhesion/cooling unit 24 has an adhesion device AD for imparting hydrophobic properties onto the surface of the substrate G with HMDS vapor and a cooling plate COL 3 for cooling the substrate G. The heating/cooling unit 25 has a hot plate HP2 for heating the substrate G and a cooling plate COL 3 for cooling the substrate G. The heating/heating unit 26 has a two-stage (upper and lower) hot plate HP2 for heating the substrate G.

The third processing section 5 has a central transporting passage 15C extending in the Y-axis direction, a third main arm mechanism 14C movably provided along the transportation passage 15C, and a plurality of processing units 28, 29, 30, 31, 32, 33, 34. Three development units 28, 29, 30 are arranged along one side of the transportation passage 15C. Each of the units 28, 29, 30 has a development apparatus DEV for developing a resist coating film by pouring a development solution onto the substrate G. Along the other side of the transportation passage 15C, a titler 31, a heating/heating unit 32, heating/cooling units 33, 34 are arranged. The second and third main arm mechanisms 14B, 14C are substantially the same as the first main arm mechanism 14A. A cooling unit 20 is provided between the first process section 3 and the second process section 4. A cooling unit 27 is provided between the second process section 4 and the third process section 5. The cooling units 20, 27 are used as a temporal stand-by position for the unprocessed substrate G.

The interface section 6 is provided between the third process section and the light exposure apparatus 7. The interface section 6 has a transportation/stand-by portion 36 and a transfer section 37. The transportation/stand-by portion 36 is equipped with the sub-arm mechanism 35 and two buffer cassettes BC. The second sub arm mechanism 35 is substantially the same as the first sub arm mechanism 13. In each of the buffer cassette BC, the unprocessed substrates G are stored. The buffer cassette BC is used as a temporal stand-by position for the substrate G. The transfer section 37 has a transfer table (not shown). The substrate G is transferred between a transfer mechanism (not shown) of the light-exposure apparatus 7 and the second sub-arm mechanism 35 via the transfer table.

Now, referring to FIGS. 3–6, the resist coating/peripheral coating film removing unit 21 will be explained.

Figure 4:
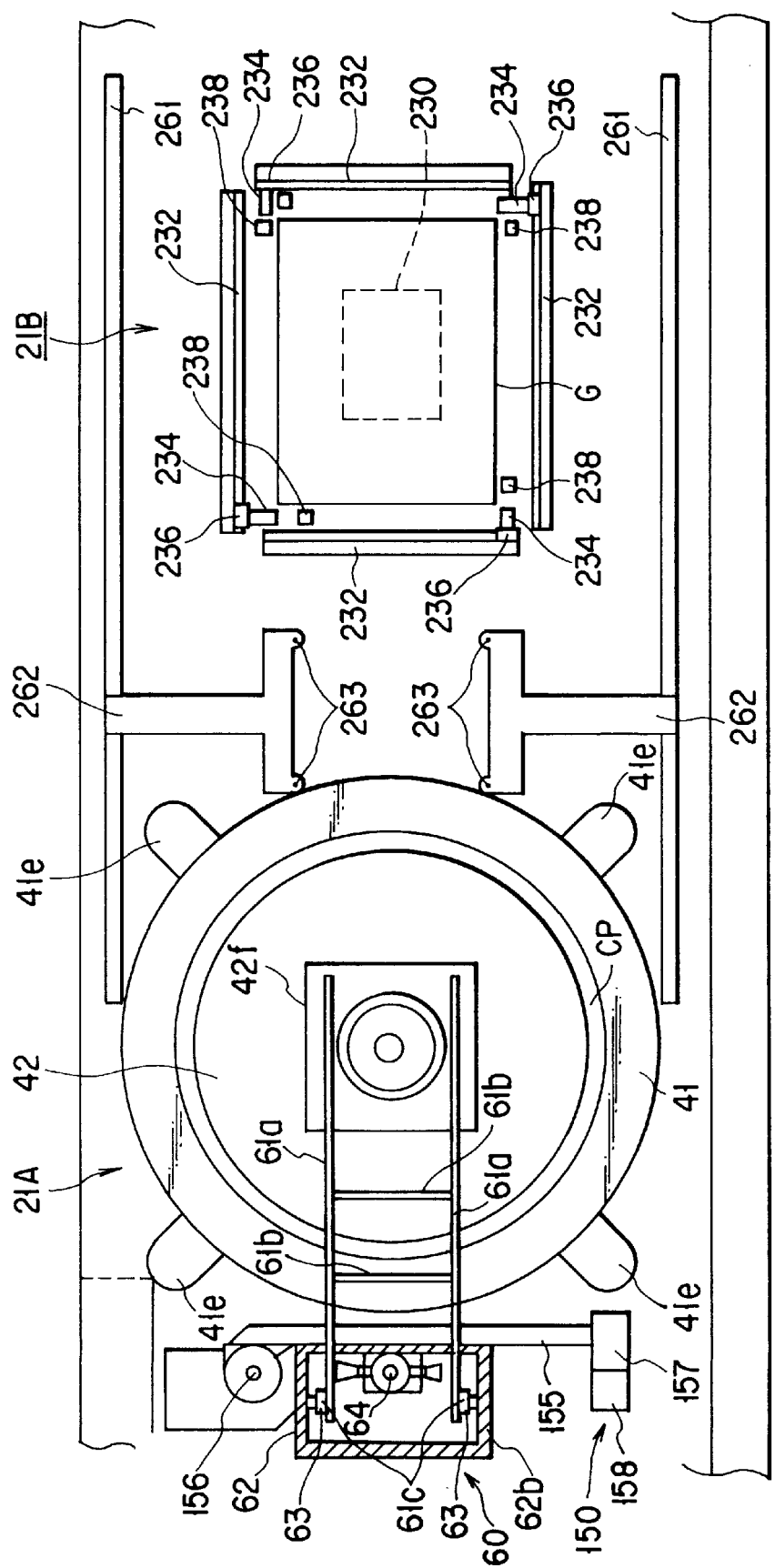
FIG. 4 is a schematic plan view of the coating/peripheral coating film removing unit.
Figure 5:
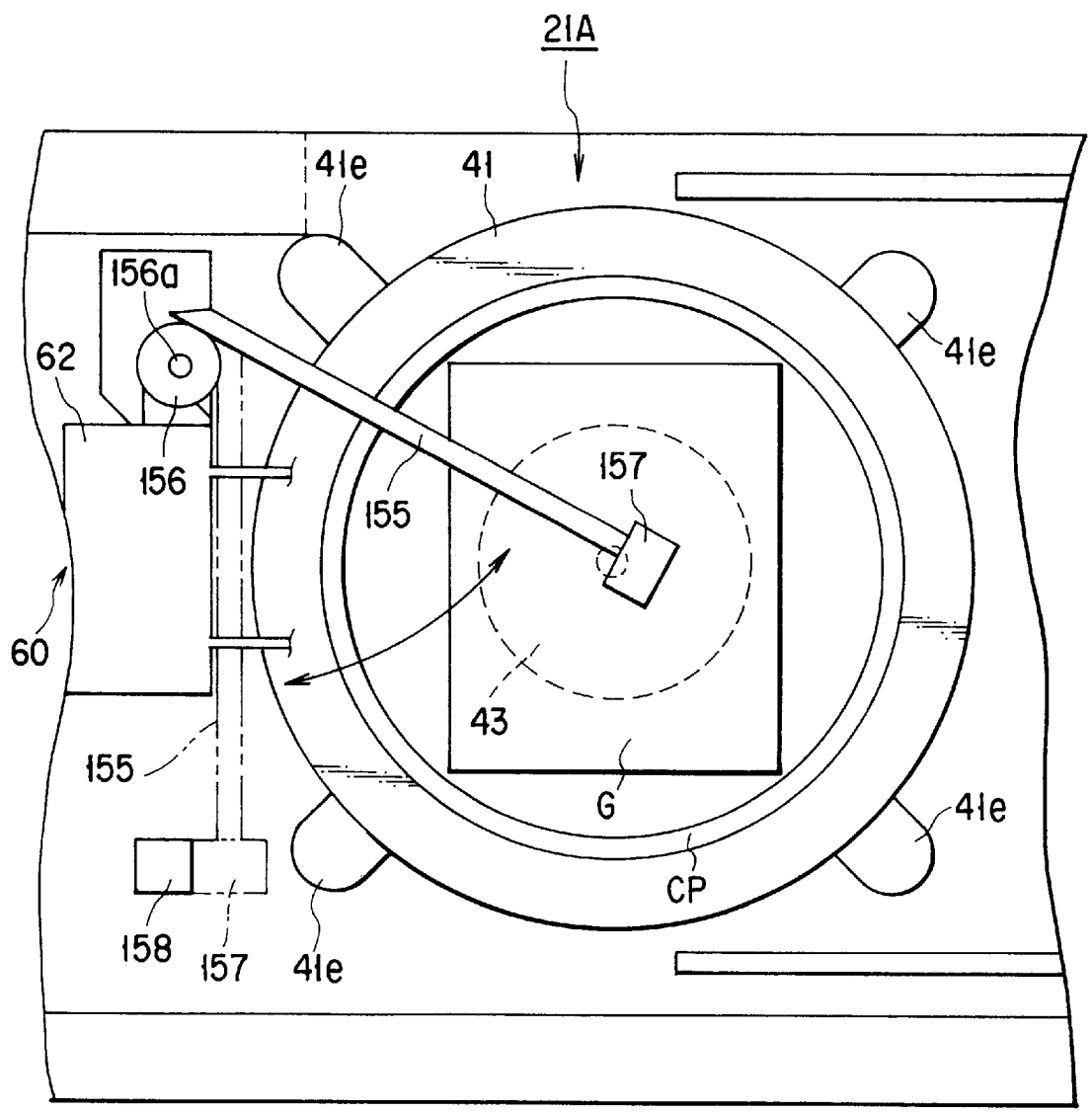
FIG. 5 is a plan view showing a state of the apparatus from which a lid has been removed.

As shown in FIGS. 4, the unit 21 has a resist coating apparatus 21A (CT) and a peripheral coating film removing apparatus 21B (ER). Two open/shut ports (not shown) are formed on a front wall of the unit 21. The substrate G is loaded into the resist coating apparatus 21A through one of the open/shut ports and unloaded from the peripheral coating film removing apparatus 21B through the other open/shut port. A transportation mechanism 262 is formed between the resist coating apparatus 21A and the peripheral coating film removing section 21B. The substrate G is transported by the transportation mechanism 262 from the resist coating apparatus 21A to the peripheral coating film removing apparatus 21B.

Figure 3:
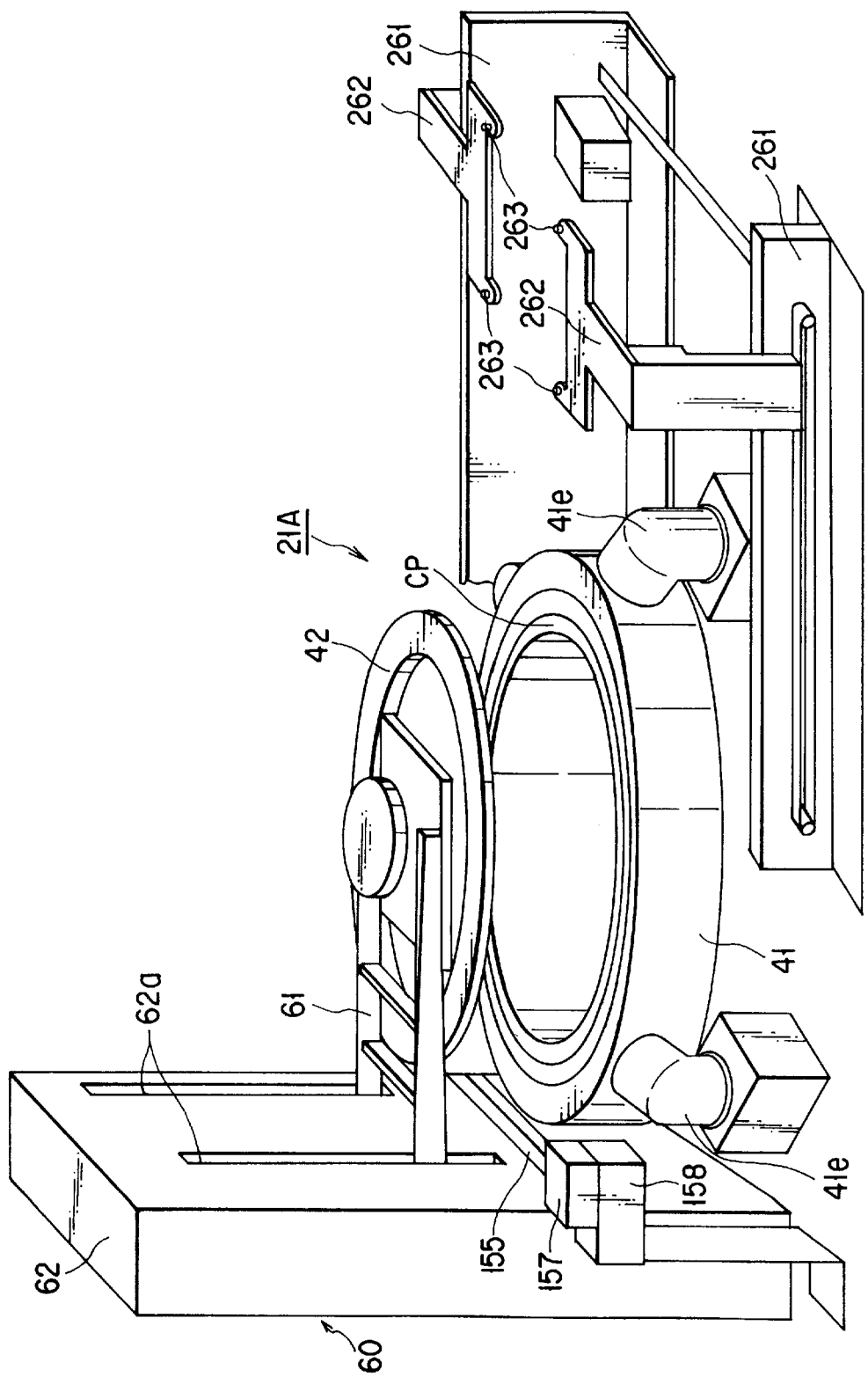
FIG. 3 is a perspective view showing a coating section of the coating/peripheral coating film removing unit.
Figure 6:
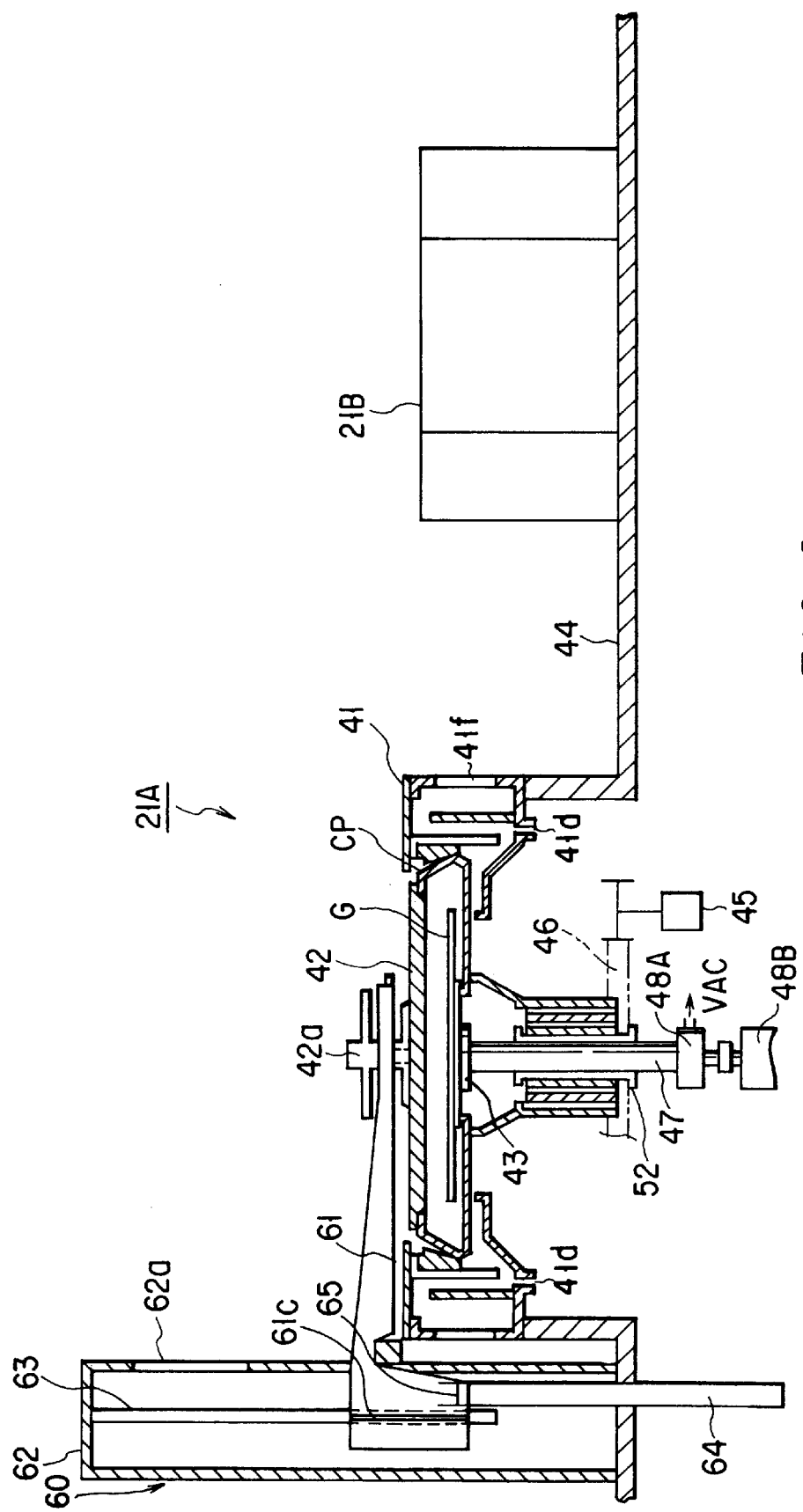
FIG. 6 is a perspective cross-sectional view showing a gist portion of the coating section.

As shown in FIGS. 3 and 6, the resist coating apparatus 21A has a spin chuck 43, a rotation cup C P, a drain cup 41, a lid 42, and a coating solution supply mechanism 150. The spin chuck 43 has a rotating mechanism with a stepping motor 45, a vacuum adsorption mechanism 48A, and a liftable cylinder mechanism 48B. A belt 46 is stretched between a driving pulley of the motor 45 and a follower pulley of the spin chuck shaft 47. One end of the passage of the vacuum adsorption mechanism 48A is opened at an upper surface of the spin chuck 43. The other end of the passage communicates with suction side of a vacuum evacuation pump (not shown) via a labyrinth sealing portion. The rod of the liftable cylinder mechanism 48B is connected to the spin chuck shaft 47.

A rotation cap CP is provided so as to surround the spin chuck 43. The rotation cap CP and the spin chuck 43 are synchronously rotated by a common motor 45. The upper portion of the rotation cup CP is opened. The lid 42 is provided so as to cover the opening. The rotation cup CP has a size of 830 mm×650 mm, which is an enough volume to store the substrate G. A plurality of discharge holes are formed in the lower peripheral portion of the rotation cup CP. Liquid drops and mist are discharged from the rotation cup CP to a drain cup 41 through the discharge holes.

The drain cup 41 is formed so as to surround the rotation cup CP. A plurality of discharge ports 41d are formed at the bottom of the drain cup 41. Discharge solution is discharged from the drain cup 41 to a recover/regeneration apparatus (not shown) through the discharge ports 41. Four exhaust ports 41f are formed at a side periphery portion of the drain cup 41. Mist is discharged from the drain cup 41 to the recover/regeneration apparatus (not shown) through the exhaust ports 41f. Note that each of the exhaust ports 41f communicates to a suction port of the vacuum evacuation pump (not shown) through the exhaust pipe 41e.

A coating solution supply mechanism 150 has a horizontal arm 155, a swinging mechanism 156, a nozzle portion 157, and a stand-by portion 158. The proximal end of the horizontal arm 155 is rotatably supported by the vertically moving shaft of the swinging mechanism 156. The nozzle portion 157 is fixed at a free end of the horizontal arm 155. The nozzle portion 157 reciprocally moves by means of the swinging mechanism 156 between the stand-by portion 158 (home position) and a portion (operation position) above a rotation center of the spin chuck 43. The nozzle portion 157 has two nozzles (not shown). One of the nozzles is used for supplying a resist solution. The other nozzle is used for supplying a solvent (thinner).

As shown in FIG. 4, the peripheral coating film removing section 21B has a table 230 for adsorbing and holding the substrate G, four guide rails 232 formed around the table 230, solvent discharge nozzles 234, movably provided along the corresponding guide rails 232, and scan-moving mechanisms 236 for moving the corresponding nozzles 234. Furthermore, a plurality of approach sensors 238 are provided appropriately so as to prevent collision of the nozzles 234.

Figure 8:
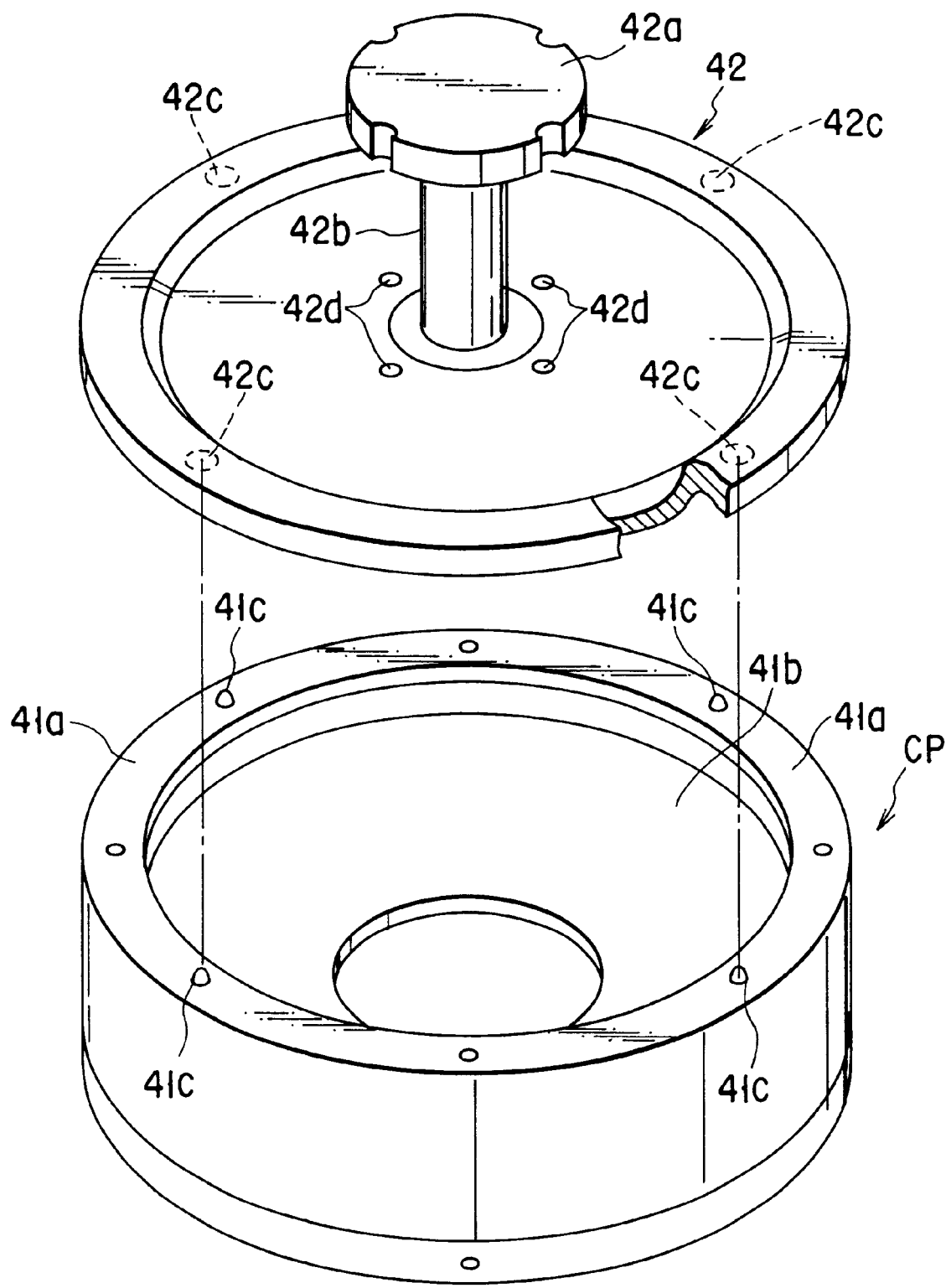
FIG. 8 is an exploded view showing a lid and a cup.

As shown in FIG. 8, the rotation cup CP is covered with the lid 42. The lid 42 is made of aluminium alloy and has a diameter of about 1100 mm. The total weight of the lid 42 and the support arm 61 is about 50 kg. A shaft 42b is threaded through the center of the lid 42. A handle 42a is provided at an upper end of the shaft 42b. A rectification plate (not shown) described later is provided at a lower end of the shaft 42b. The handle 42a is connected to the support arm 61 of a lifting mechanism 60 described later.

The peripheral portion of the cup 42 is slightly higher than the other portion thereof, thereby forming a peripheral stepped portion. A plurality of recesses 42c are formed at the lower surface of the peripheral stepped portion. On the other hand, a plurality of projections 41c are formed on the upper surface of the peripheral portion of the rotation cup CP. When the lid 42 is placed on the rotation cup CP, the recesses 42 are engaged with the corresponding projections 41c, thereby fixing the lid 42 to the rotation cup CP. As a result, the lid 42 is tightly integrated to the rotation cup CP to form a processing space inside the cup.

The rectification plate (not shown) is attached to the lower portion of the lid 42. Air is introduced into the processing space through air supply holes 42d, spreads radically along the rectification plate, and flows out from the processing space to the drain cup 41 through the exhaust ports. The air flow plays a role in discharging liquid drops and mist of the resist solution from the processing space swiftly and smoothly. Since the air supply holes 42d play a role in preventing the inner pressure of the rotation cup CP from being reduced to an excessively negative value. The lid 42 can be therefore removed off easily from the rotation cup CP.

As shown in FIG. 6, the spin chuck 43 is moved down by the liftable cylinder mechanism 48B to a position lower than the upper surface of the cup CP 41 during the coating time. On the other hand, when the substrate is transferred, the spin chuck 43 is moved up by the liftable cylinder mechanism 48B to a position higher than the upper surface of the cup CP 41.

Next, referring to FIGS. 3–15 and FIGS. 18–20, the liftable mechanism 60 for ascending the lid 42 will be explained.

As shown in FIG. 4, the liftable mechanism 60 is arranged within the coating section 21A at the longest distance from the peripheral coating film removing section (edge remover) 21B. The liftable mechanism 60 has a support arm 61 and a guide post 62. The support arm 61 extends horizontally from the guide post 62. The lid 42 is supported by the support arm 61 at the one distal end of the support arm 61. The support arm 61 has a pair of arm members 61a sandwiching the lid 42 and two ribs 61b for reinforcing the pair of arm members 61a by mutually connecting them.

As shown in FIG. 3, a pair of grooves 62a are formed vertically in parallel in the front surface of the guide post 62. The arm members 61a are moved while being guided through the corresponding grooves 62a. As shown in FIGS. 4 and 6, linear guides 63 are vertically formed on the corresponding inner walls of the guide post 62. To each of the linear guides 63, a corresponding proximal end portion of the arm member 61a is fixed via a rod-form projection 61c.

As shown in FIG. 6, a cylinder mechanism 64 is provided at a lower portion of the support arm 61. The cylinder mechanism 64 is passed through a bottom plate 44. An upper half portion of the cylinder mechanism 64 is located within the guide post 62 and a lower half portion thereof is present outside the guide post 62.

As shown in FIGS. 7, 18–20, three shock absorbers 190A, 190B, 190C are attached to the guide post 62 for the sake of security and damage protection. The first shock absorber 190A is attached to the upper portion of the guide post 62 and plays a role in absorbing and mitigating shock due to the collision of the support arm 61 when it is lifted rapidly. The second shock absorber 190B is attached to the lower portion of the guide post 62 and plays a role in absorbing and mitigating shock due to the collision of the lid 42 when it falls rapidly. The third shock absorber 190C is attached to the tip of the horizontal arm 192 supported by the support post 193. To the horizontal arm 192, a slit guide 192a is formed. The arm 192 is fastened to the support post 193 by a fixing tool 194 through the slit guide 192a. When the fixing tool 194 is loosened, the arm 192 is ready to slide, with the result that the third shock absorber 190C can be loaded into and unloaded from the internal portion of the guide post 62. The third shock absorber 190C is loaded into the internal portion of the guide post 62 during the substrate processing time and unloaded from the internal portion of the guide post 62 during the maintenance operation.

Next, referring to FIGS. 7 and 9–11, the cylinder mechanism of the cup lifter 60 will be explained more specifically.

The rod 65 can project and withdraw from the upper portion 65a of the cylinder mechanism 64. The upper portion 65a of the rod 65 is connected to a lower portion of the support arm 61. On the other hand, the lower portion of the rod 65 is connected to a piston 66.

Figure 7:
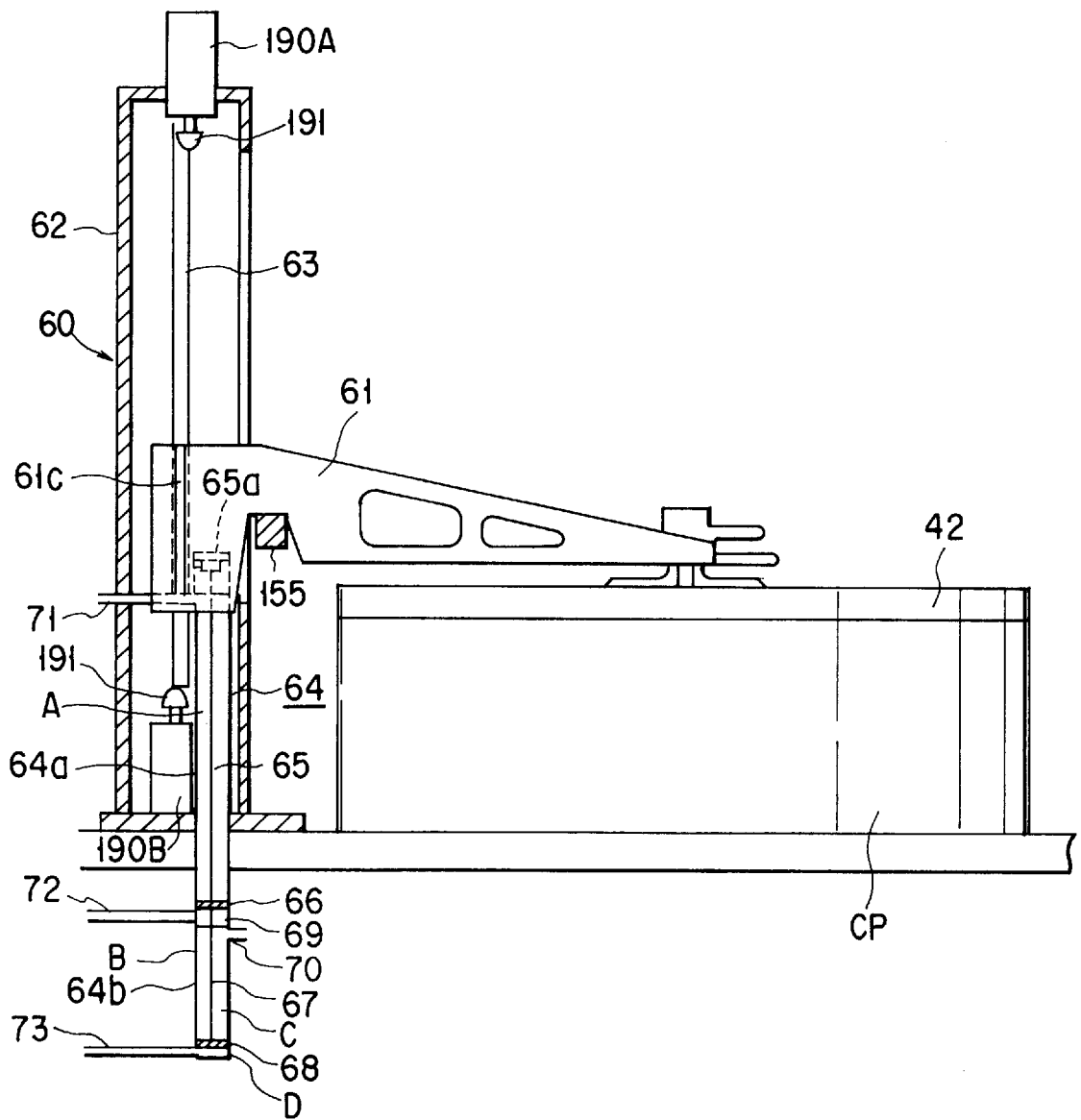
FIG. 7 is a perspective cross-sectional view of a lid lifting cylinder mechanism of the substrate processing apparatus according to an embodiment of the present invention.
Figure 9:
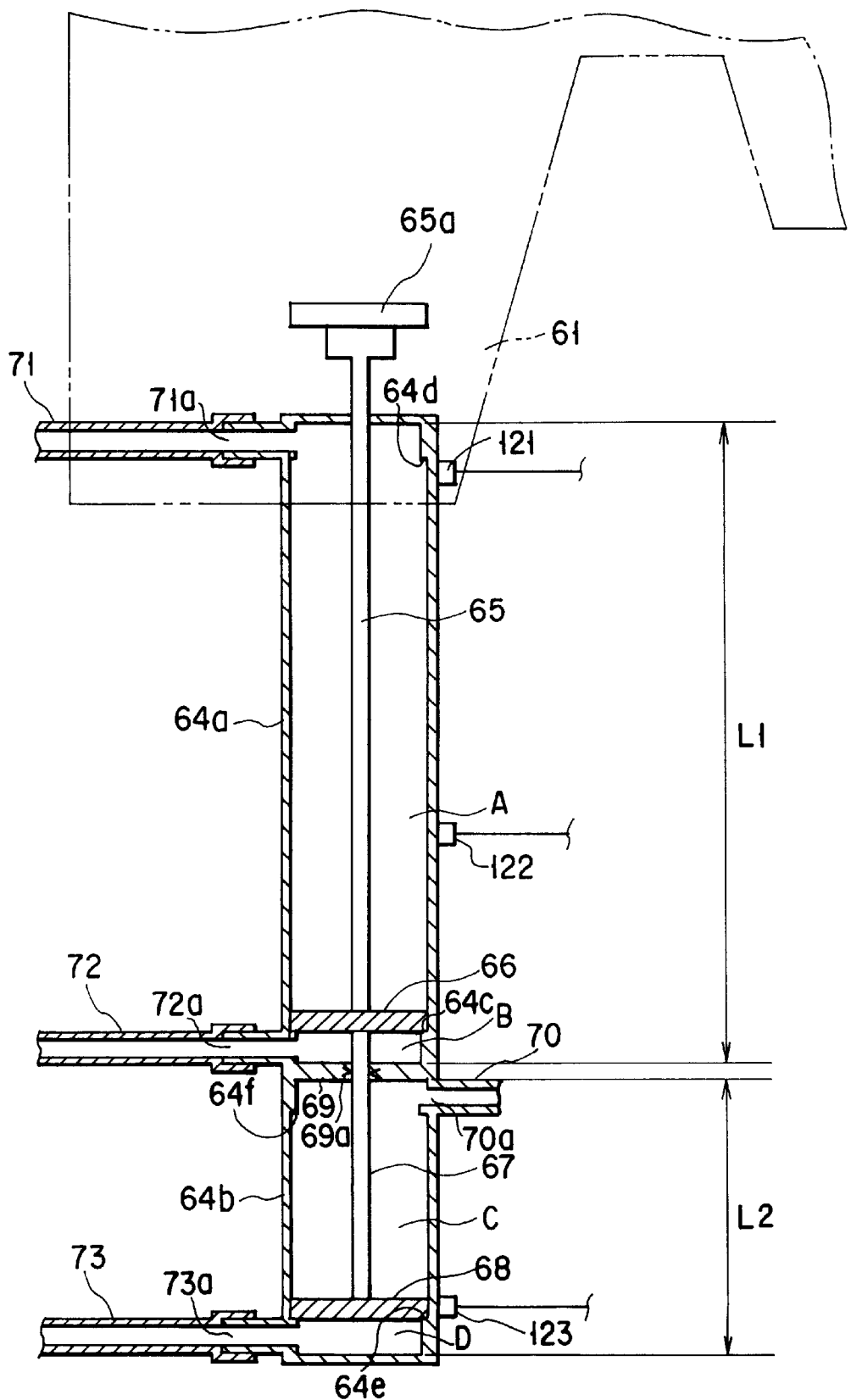
FIG. 9 is a magnified cross sectional view of a lid lifting cylinder mechanism (with the lid closed) during coating processing time.

As shown in FIGS. 7 and 9, the cylinder mechanism 64 has a first cylinder 64a (upper side) and a second cylinder 64b (lower side). A partition plate 69 is formed between the first cylinder 64a and the second cylinder 64b. The cylinder mechanism 64 is divided into an upper cylinder chamber A, B (first and second air chambers) and a lower cylinder chamber C, D (third and fourth air chambers) by the partition plate 69.

In the first cylinder 64a, a first piston 66 and a rod 65 are liftably provided. The inner space of the first cylinder 64a is divided into a first air chamber A (upper chamber) and a second air chamber B (upper chamber) by the first piston 66. Note that the first piston 66 moves from a lower stepped portion 64c to an upper stepped portion 64d of the first cylinder 64a. The stroke L4 is 450 to 500 mm. Furthermore, the second piston 68 moves between a lower stepped portion 64e and an upper stepped portion 64f of the second cylinder 64a. The stroke L3 is 220 to 250 mm.

To detect the positions of the first and second pistons 66, 68, respectively, three magnet sensors 121, 122, 123 are attached to the outer walls of the cylinders 64a, 64b. The first sensor 121 is attached to the wall at a distance of L4 from the lower stepped portion 64c (i.e., near the upper stepped portion 64d). The second sensor 122 is attached to the wall at a distance of L3 from the lower stepped portion 64c of the first cylinder 64a. The third sensor 123 is attached to the wall at a distance of L3 from the lower stepped portion 64e of the second cylinder 64b (i.e., near the upper stepped portion 64f).

To each of the pistons 66, 68, a permanent magnet (not shown) is buried. When the pistons 66, 68 face the magnet sensors 121, 122, 123 with the cylinder wall interposed therebetween, a magnet flux leaking from each of the permanent magnets is detected by the sensors 121, 122, 123 and the detection signal is sent to the controller 201.

A pipe 71 is attached to the upper portion of the first cylinder 64a and a pipe 72 is attached to the lower portion of the first cylinder 64a. These pipes 71 and 72 communicate with an air supply system 200 (see FIG. 12) described later. Air is introduced into and discharged from the first air chamber A and the second air chamber B by way of the flow passages 71a and 72a, respectively.

In the second cylinder 64b, a second piston 68 and a rod 67 are liftably provided. The inner space of the second cylinder 64b is divided into a third air chamber C (upper air chamber) and a fourth air chamber D (lower air chamber) by the second piston 68.

A pipe 70 is attached to the upper portion of the second cylinder 64b and a pipe 73 is attached to the lower portion of the second cylinder 64b. The pipes 70 and 73 communicate with the air supply system 200 (see FIG. 12) described later. Air is introduced into and discharged from the third air chamber C and the fourth air chamber D by way of flow passages 70a and 73a, respectively.

A through-hole is formed at the center of the partition plate 69. The second rod 67 goes into and out of the second air chamber B of the first cylinder 64a through the through-hole. A V seal 69a is provided between the second rod 67 and the partition plate 69. The V seal protects air leakage between the second air chamber B and the third air chamber C. The V seal is low in frictional resistance, and therefore, the second rod 67 can slide smoothly through the through-hole of the partition plate 69.

The second rod 67 is longer than the second cylinder 64b, so that the tip portion of the rod 67 is always present within the second air chamber B. The second rod 67 and the piston 68 are mutually connected. Similarly, the first rod 65 is connected to the piston 66. However, the second rod 67 is not connected to (that is, separated from) the first piston 66. The second rod 67 can be sometimes in contact with the first piston 66, as shown in FIGS. 9 and 10, and sometimes separated from the first piston 66, as shown in FIG. 11.

Figure 10:
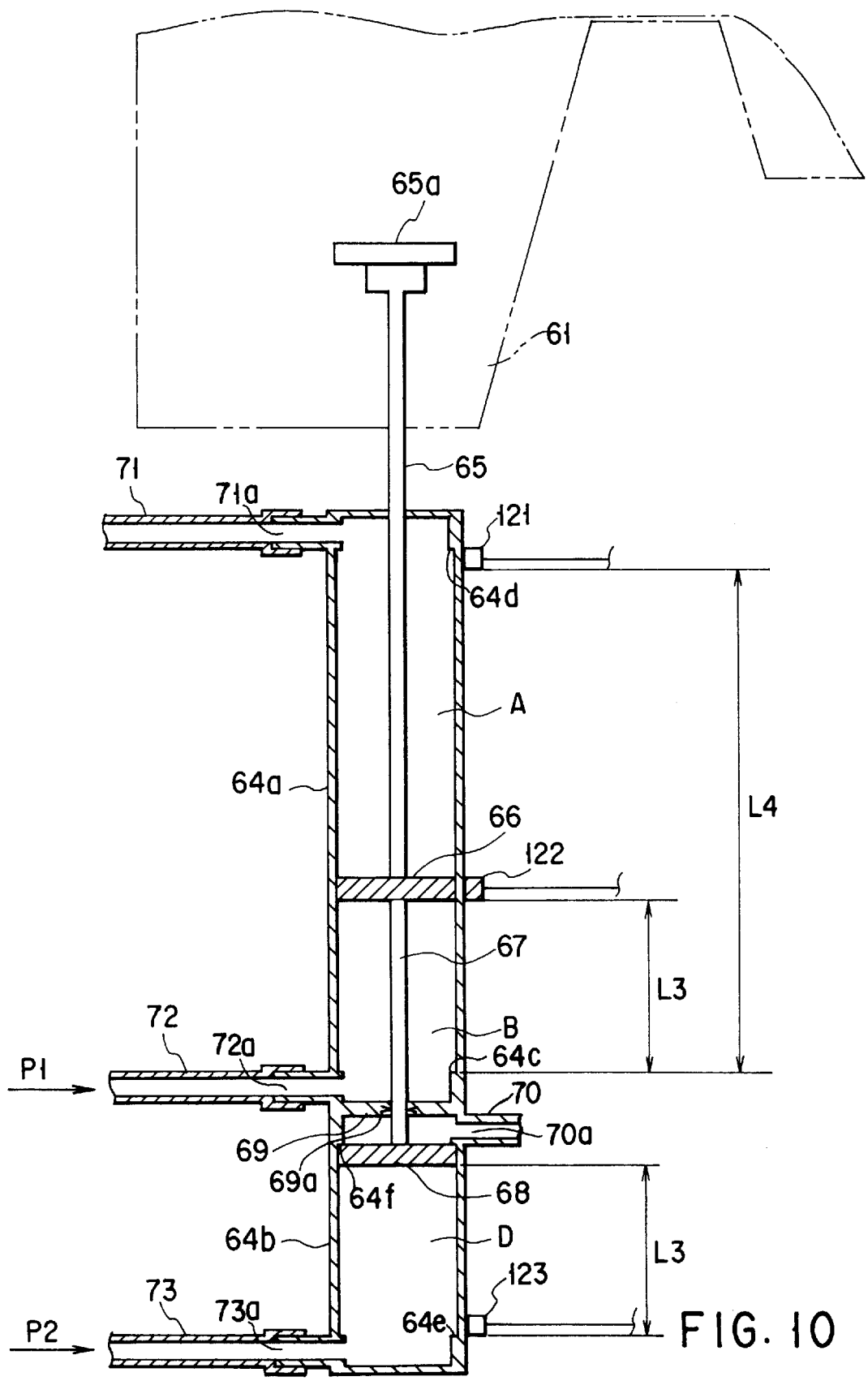
FIG. 10 is a magnified cross sectional view of the lid lifting cylinder mechanism (with the lid open) during coating processing time.
Figure 11:
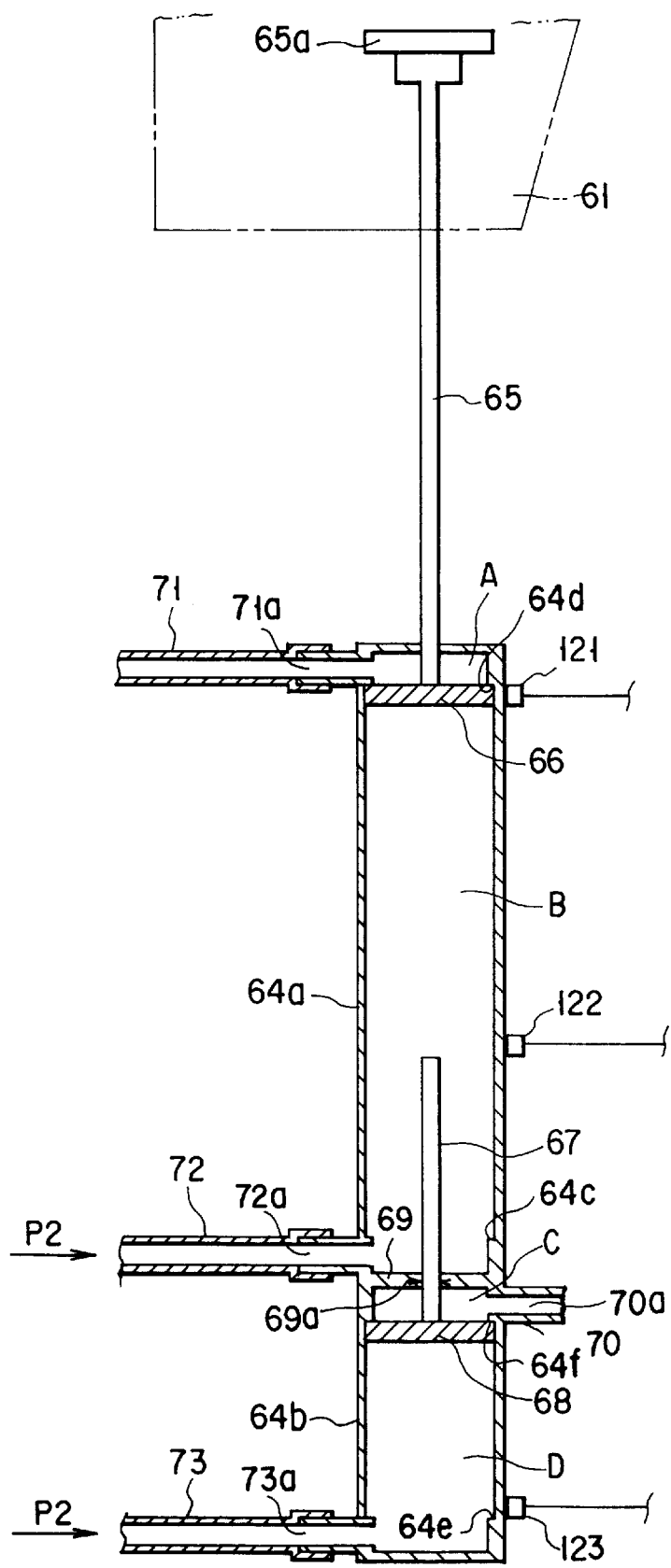
FIG. 11 is a magnified cross sectional view of the lid lifting cylinder mechanism (with the lid lifted up to the uppermost limit) during the maintenance time.
Figure 12:
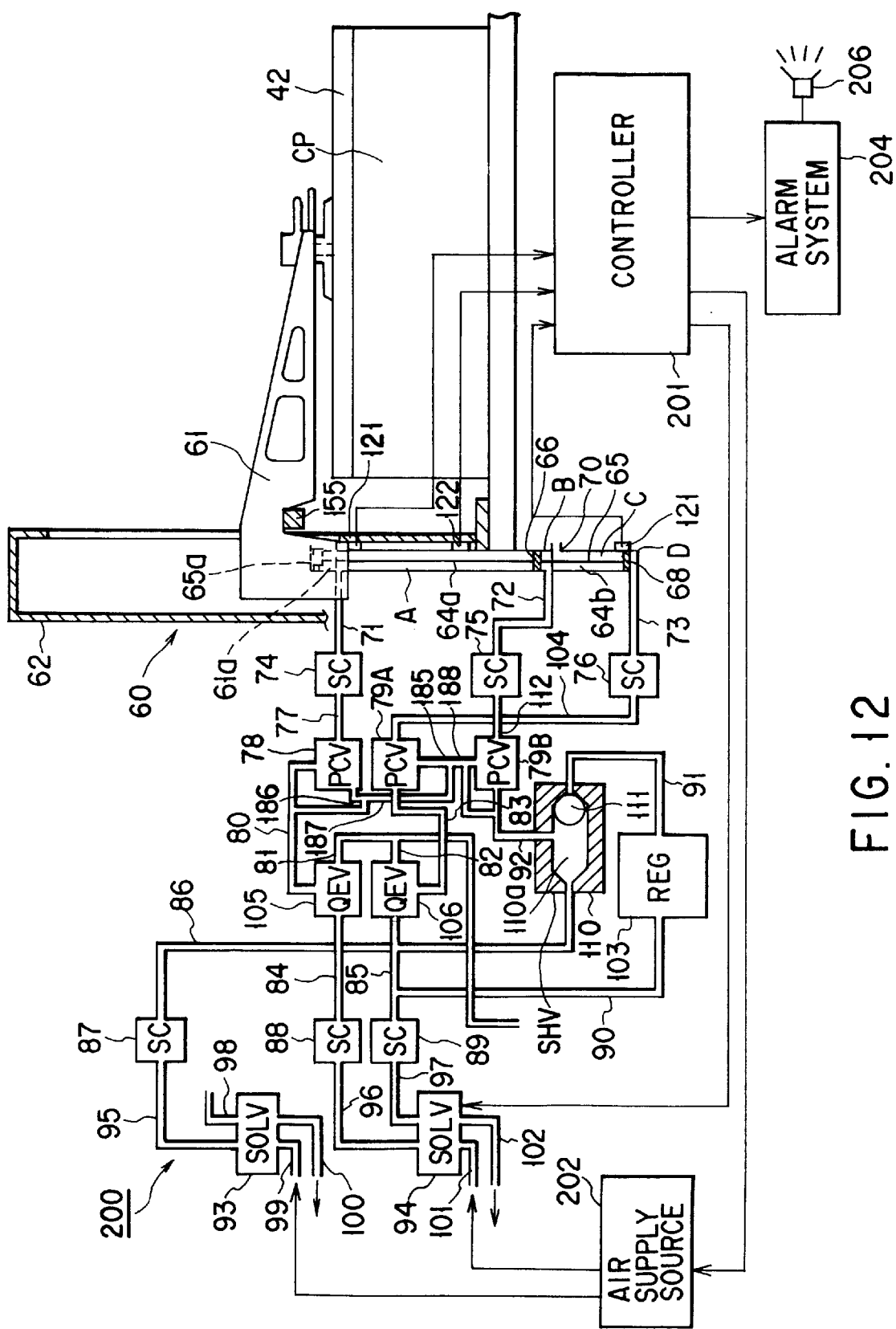
FIG. 12 is a block circuit diagram of the substrate processing apparatus according to an embodiment of the present invention.

Next, referring to FIGS. 9–11, we will explain how to operate the cylinder mechanism 64 when air is supplied.

As shown in FIG. 9, when air is not supplied to the flow passages 71a, 72a, 73a, both first and second pistons 66, 68 are positioned at the lowest positions (lower dead center) of the first and second cylinders 64a, 64b while the upper end of the second rod 67 is in touch with the lower center portion of the first piston 66.

Figure 17:
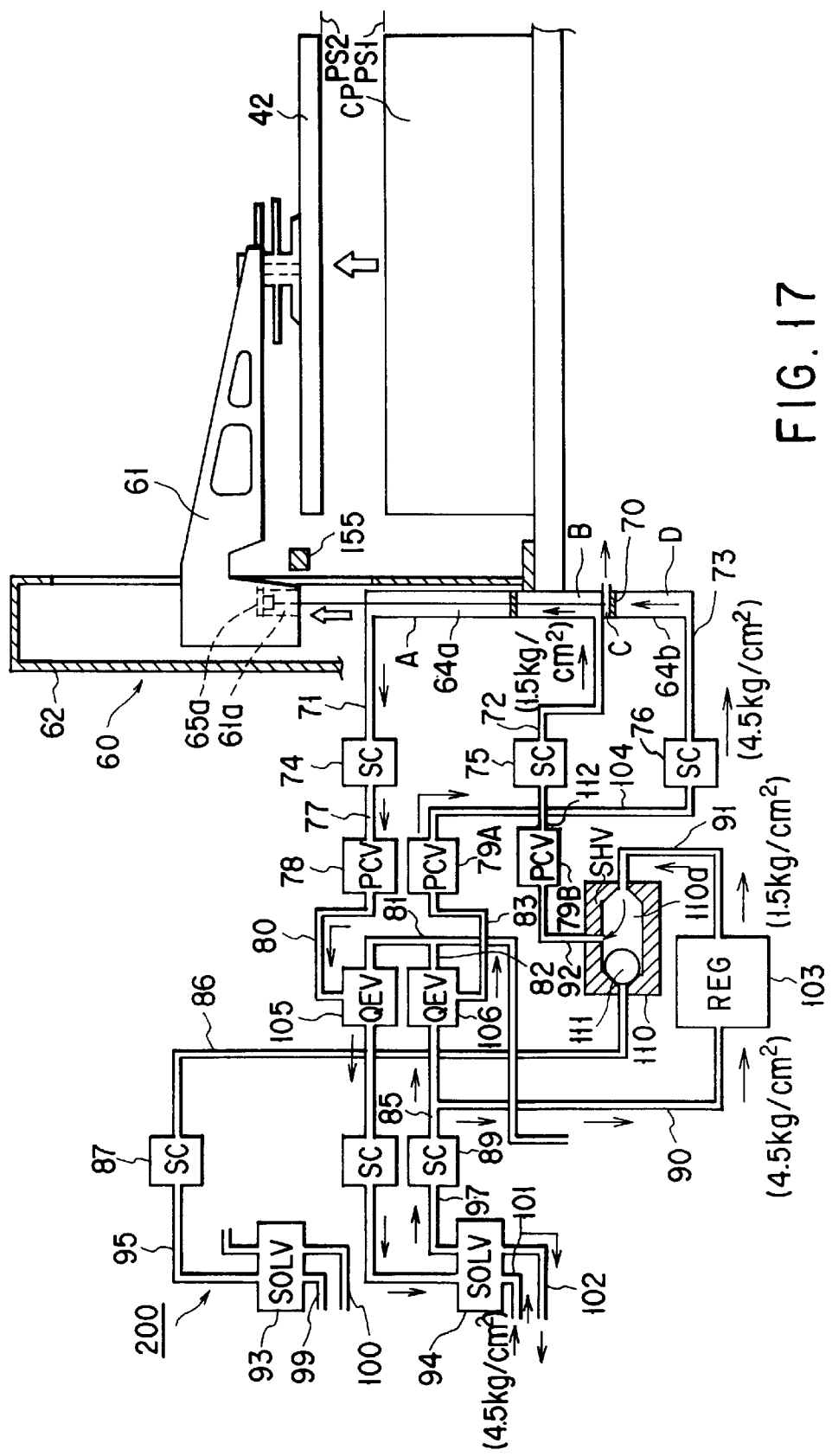
FIG. 17 is a block circuit diagram showing how to open the lid in a substrate processing apparatus according to an embodiment of the present invention.

When air of a pressure P2 is supplied to the fourth air chamber D, as shown in FIG. 10, the second piston 68 is moved up and the second rod 67 comes into contact with the first piston 66 to push up the first piston 66. At the same time, air of a pressure P1 is supplied to the second air chamber B, thereby applying an ascendable force to the first piston 66. By virtue of the ascendable force, the lid 42 is lifted up from a first position PS1 (the position of the cup CP) to a second position PS2 (position of the lid opened during the substrate processing time), as shown in FIG. 17.

As shown in FIG. 11, when the pressure P2 air is supplied to the second air chamber B, the first piston 66 is further moved up to the upper dead center of the first cylinder 64a. As a result, the lid 42 is raised from the second position PS2 to a third position PS3 (position of the lid opened during the maintenance operation time).

In this case, the pressure P1 air is supplied from the flow passage 72a to the second air chamber B and the pressure P2 air is supplied from the pipe 73 to the fourth air chamber D. The pressures P1 and P2 have the relationship represented by the following inequality (1):

$$P1 < W < P2 \tag{1}$$

where P1 is a pressure of air to be supplied to the first cylinder 64a (second air chamber B), W is a pressure of air required for lifting the support arm 61 and the lid 42, and P2 is a pressure of air to be supplied to the second cylinder 64b (fourth air chamber D).

With this mechanism, an upwardly and vertically working driving force is applied to both first and second pistons 66, 68. At this point, the second piston 68 is driven by the pressure P2 air since the relationship "W<P2" represented by the inequality (1) is satisfied. Therefore, the support arm 61 and the lid 42 can be lifted up by means of the second piston 68 alone.

On the other hand, the upwardly and vertically working driving force is also applied to the first piston 66. The driving force is produced due to the supply of the pressure P1 air. In this case, the air pressure W is smaller than the air pressure W (P1<W) as represented by the inequality (1). Therefore, the support arm 61 and the lid 42 cannot be lifted up by the first piston 66 alone.

As a result, the support arm 61 and the lid 42 are lifted up by a stroke L3 of the second piston 68 by the cylinder mechanism 64 as a whole. The first and second pistons 66, 68 are moved upward by the same stroke L3 while leaving the second rod 67 in contact with the first piston 66.

As described, a load to lift up the support arm 61 and the lid 42 is imposed mainly on the second cylinder 64b (lower cylinder) has during general substrate processing time. In this case, the first piston 66 is pushed up by the second rod 67. Note that driving force is also applied to the first piston 66 from the first cylinder 64a, even if it works auxiliarily. Therefore, the speed for lifting up the support arm 61 and the lid 42 by the first and second cylinders 64a, 64b is faster than that by the second cylinder 64b alone.

Figure 19:
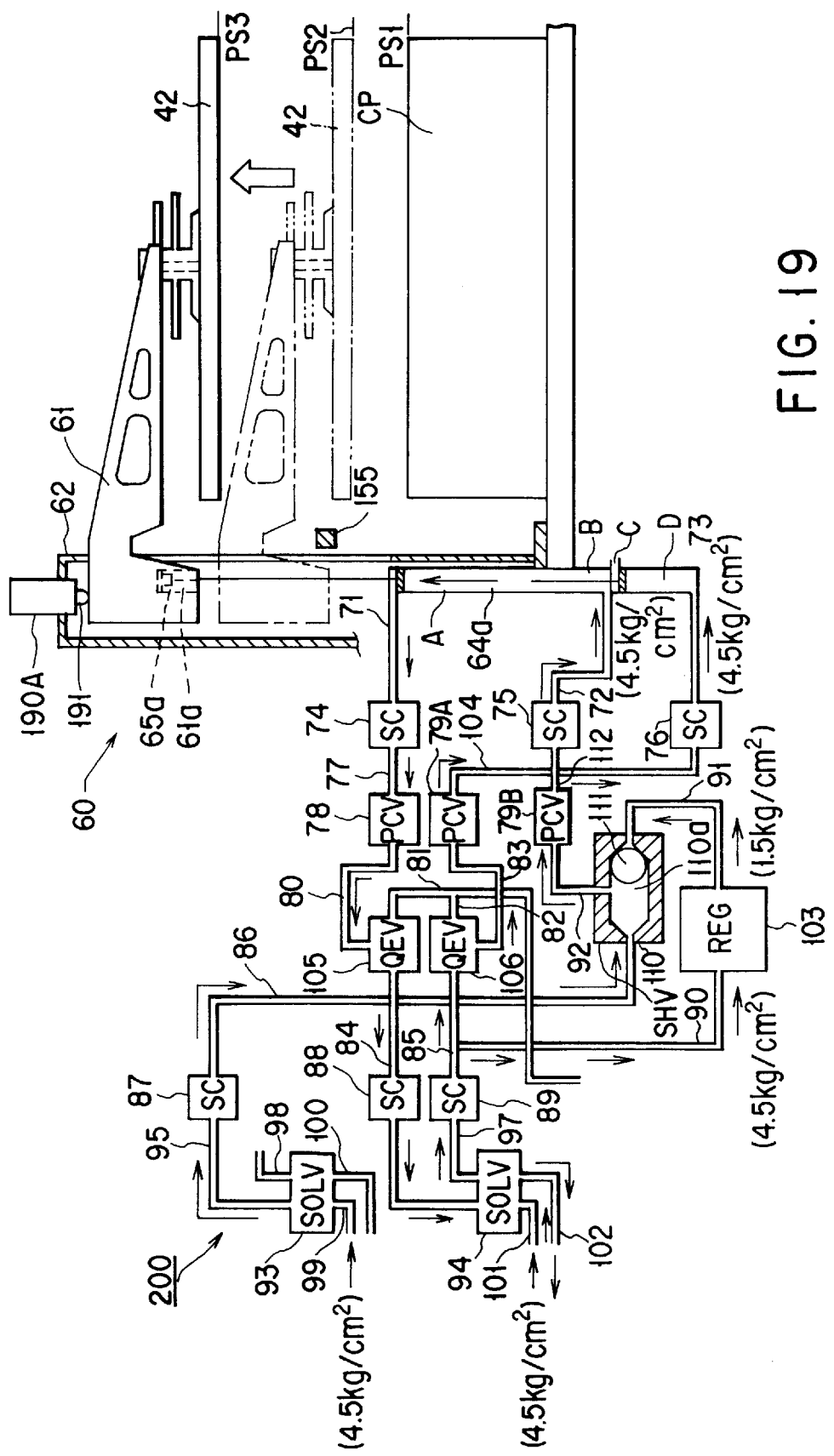
FIG. 19 is a block circuit diagram showing how to allow the lid to step aside during the maintenance time in the substrate processing apparatus according to an embodiment of the present invention.
Figure 20:
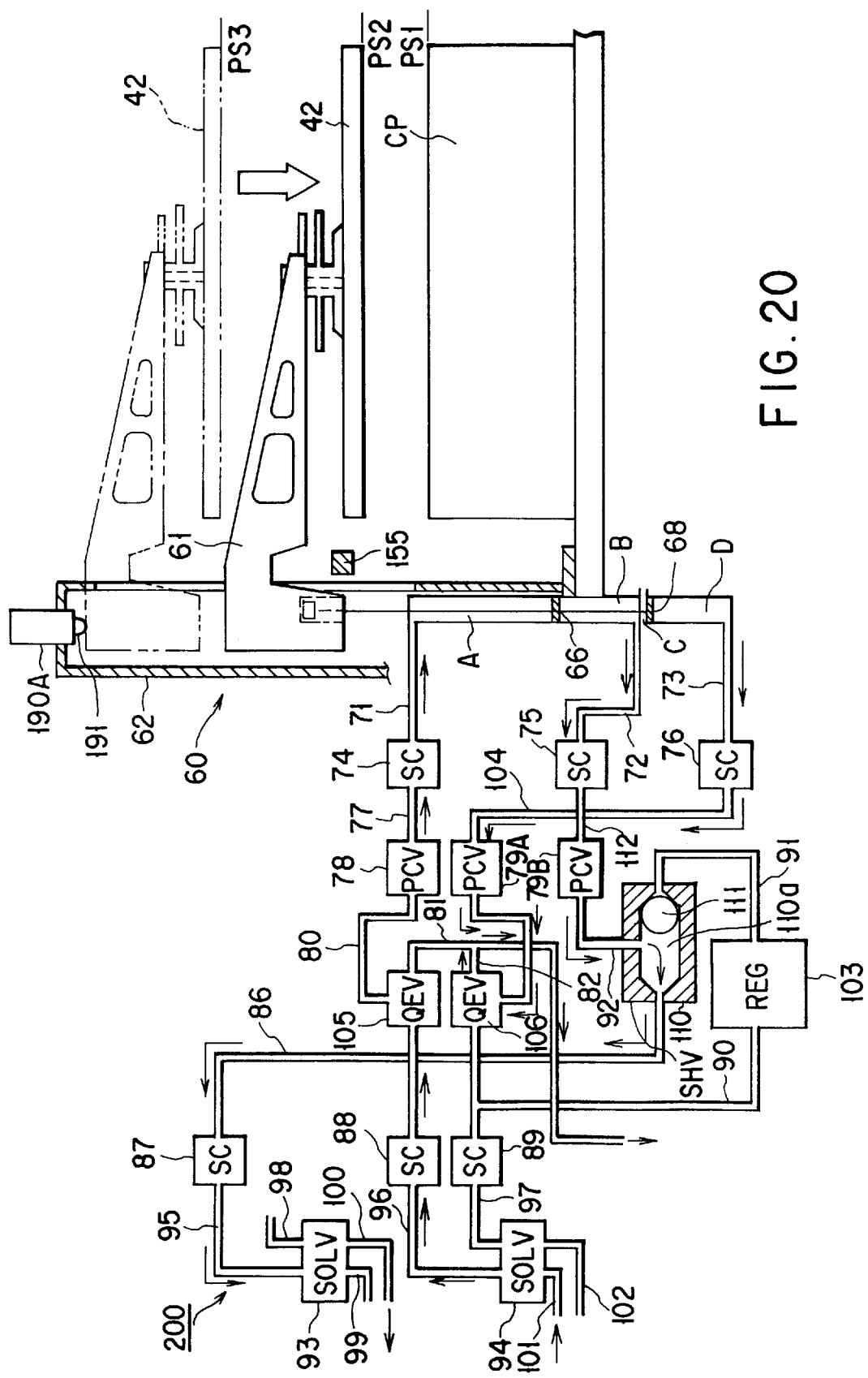
FIG. 20 is a block circuit diagram showing how to return the lid during the maintenance time in the substrate processing apparatus according to an embodiment of the present invention.

Now, referring to FIGS. 11, 19, 20, we will explain how to open and close the lid 42 during the maintenance operation time.

First, the pressure P1 air is supplied from the flow passage 72a into the second air chamber B; at the same time, the pressure P2 air is supplied from the flow passage 73a to the fourth air chamber D. As a result, the lid 42 is lifted up from the first position PS1 to the second position PS2.

Then, the circuit of the air supply system 200 is switched. More specifically, while maintaining the pressure of the pressure P2 air supplied from the flow passage 73a, the pressure of the air supplied from the flow passage 72a is changed from P1 to P2. By this switching operation, a sufficient magnitude of driving force to lift the support arm 61 and the lid 42 is applied to the first piston 66. Consequently, the first piston 66 starts lifting up the support arm 61 and the lid 42 by itself.

Finally the first piston 66 is moved up to the upper dead point of the first cylinder 64a and then stopped, as shown in FIG. 11. In this case, the support arm 61 is lifted up by the first piston 66 alone. However, since the pressure P2 air alone is used as the driving source, the speed for lifting up the lid during the maintenance operation time is slower than that during the substrate processing time. However, the time period required for opening the lid 42 is short compared to the entire maintenance operation time. Therefore, it is acceptable even if the lid is lifted slower.

As described, the first rod 65 is much longer than the second rod 67. Therefore, the support arm 61 can be lifted up to a sufficient level to ensure a space for the maintenance operation between the lid 42 and an upper frame of the coating apparatus 21A.

Next, referring to FIGS. 12 and 9–11, we will explain the air supply system 200 for supplying air to the cylinder mechanism 64.

The air supply system 200 has a controller 201 for controlling operation of the various elements (fluid machines). When the cup lifter 60 is mistakenly operated, the controller 201 sends a signal to an alarm system 204 to ring the alarm 206, thereby notifying that the abnormal operation takes place. At the same time, the controller 201 sends a signal for terminating the abnormal operation to a cup lifter driving portion.

A pipe 71 communicates with the first air chamber A positioned at the upper portion of the first cylinder 64a. The pipe 71 communicates with a solenoid valve (SOLV) 94 by way of a speed controller (SC) 74, a pipe 77, a pilot check valve (PCV) 78, a pipe 80, a quick exhaust valve (QEV) 105, a pipe 84, a speed controller (SC) 88 and a pipe 96. The solenoid valve (SOLV) 94 has a supply pipe 101 and an exhaust pipe 102. The supply pipe 101 communicates with a supply port of the air supply source 202. Furthermore, a pipe 97 of the solenoid valve (SOLV) 94 communicates with the fourth air chamber D positioned at the lower portion of the second cylinder 64b.

The pipe 72 communicates with the second air chamber B positioned at the lower portion of the first cylinder 64a. The pipe 92 communicates with a shuttle valve (SHV) 110 by way of a speed controller (SC) 75, a pilot check valve (PVC) 79B and a pipe 92. The shuttle valve (SHV) 110 has a valve chamber 110a and a ball valve body 111. Three pipes 86, 91 and 92 communicate with a valve chamber 110a. The first pipe 86 communicates with a speed controller (SC) 87. The speed controller (SC) 87 communicates with the solenoid valve (SOLV) 93 by way of a pipe 95. The solenoid valve (SOLV) 93 has a supply pipe 99 and an exhaust pipe 100. Furthermore, the solenoid valve (SOLV) 93 has a pipe 98 required for switching the supply line to the exhaust line. The end of the pipe 98 is opened to atmosphere.

The second pipe 91 communicates with an inlet side of the regulator (REG) 103. A pipe 90 communicates to the outlet side of the regulator (REG) 103. The pipe 90 merges with the pipe 85 in the middle way from the solenoid valve (SOLV) 94 to the fourth air chamber D positioned at the lower portion of the second cylinder 64b. The third pipe 92 communicates with the second air chamber B positioned at the lower portion of the first cylinder 64a by way of the pilot check valve (PCV) 79B, the speed controller (SC) 75 and the pipe 72.

The pipe 70 communicates with the third air chamber C positioned at the upper portion of the second cylinder 64b and opened to air by way of a pipe not shown. On the other hand, the pipe 73 positioned at the lower portion of the second cylinder 64b communicates with the fourth air chamber D. The pipe 73 communicates with the solenoid valve (SOLV) 94 by way of a speed controller (SC) 76, a pipe 104, a pilot check valve (PCV) 79A, a pipe 83, a quick exhaust valve (QEV) 106, a pipe 85, a speed controller (SC) 89, and a pipe 97.

Next, referring to FIGS. 13–15, various elements used in the circuit of the air supply system 200 will be explained.

The solenoid valves (SOLV) 93 and 94 are valves electrically driven and responsible for initiating and terminating supply and exhaust of the air and for switching the flowing direction of the air through the pipe back and forth.

Figure 13:
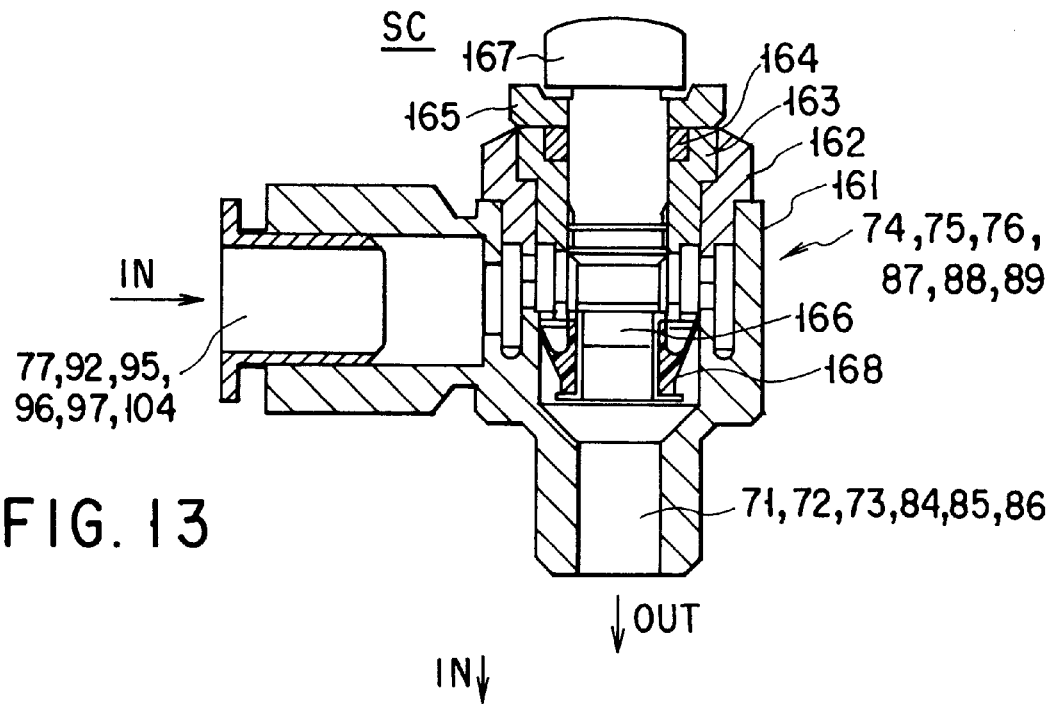
FIG. 13 is a longitudinal sectional view of a speed controller (SC)

As shown in FIG. 13, each of the speed controllers (SC) 74, 75, 76, 87, 88, 89 is a flow amount controller having a needle 166 between an inlet 77, (92, 95, 96, 97, 104) and an outlet 71, (72, 73, 84, 85, 86). The inlet 77 (92, 95, 96, 97, 104) of a main body (161) is crossed at a right angle with the outlet 71 (72, 73, 84, 85, 86). The needle 166 is attached to the main body 161 via a body ring 162, a sheet ring 163, a guide 164, and a rock nut 165. When the handle 167 is turned, the tip of the needle 166 touches on and off a U-shape packing 168, so that a sectional area of the passage varies.

Figure 14:
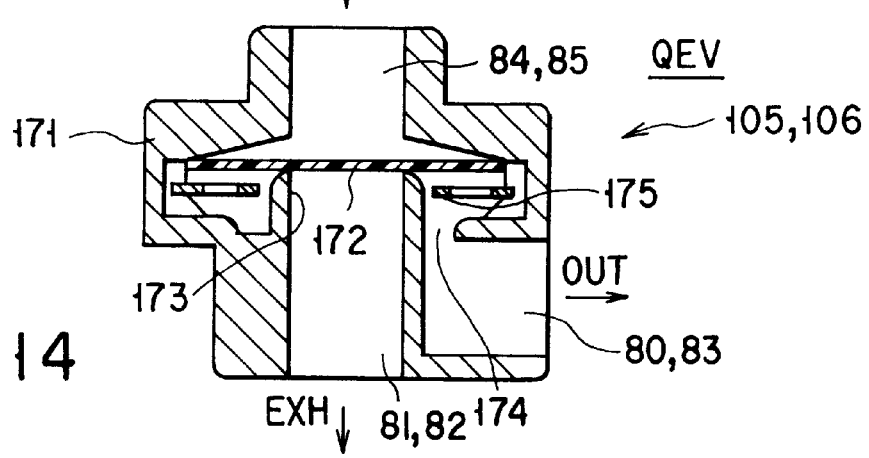
FIG. 14 is a longitudinal sectional view of quick exhausting valve (QEV)

As shown in FIG. 14, each of the quick exhaust valves (QEV) 105, 106 includes a main body 171 having an inlet 84 (85), an outlet 80 (83), and an emergency exhaust port 81 (82), a flexible valve 172, a first valve seat 173, and a second valve seat 175. When the quick exhaust valve (QEV) is used during the normal operation time, the flexible valve body 172 is in contact with the first and second valve seats 173, 175 while closing the emergency exhaust port 81 (82). The fluid therefore flows from the inlet 84 (85) to the outlet 80 (83). In the case where evacuation should be made efficiently in a short time, the flexible valve body 172 is separated from the first valve seat 173 to thereby open the emergency exhaust port 81 (82). Consequently, the fluid flows from the inlet 84 (85) toward the emergency exhaust port 81 (82). Since the emergency exhaust port 81 (82) has a diameter larger than a narrowed portion 174 of the outlet 80 (83), fluid can be discharged from the emergency port at high speed for a short time through the emergency outlet.

Figure 15:
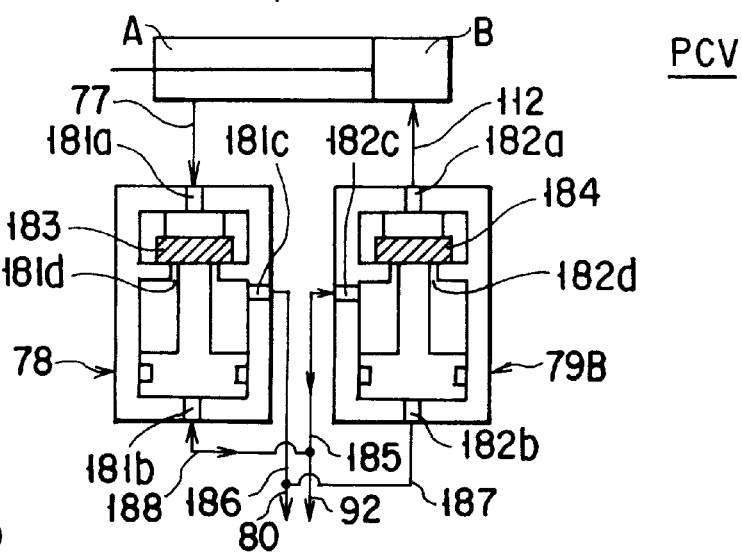
FIG. 15 is a circuit diagram of a pilot check valve (PCV)

As shown in FIG. 15, each of the pilot check valves (PVC) 78, 79B (79A) has valve body 183 (184) serving as a security device in case of occurrence of abnormal pressure. A port 181a of the check valve 78 communicates with the first air chamber A. A port 182a of the other check valves 79B (79A) communicates with the second air chamber B (the fourth air chamber D). The valve bodies 183, 184 are slidably provided in order to open/close the inner passages 181d, 182d, respectively. The flow passage 80 communicates with both a port 181c of the check valve 78 and a pilot pressure port 182b of the check valve 79B. The flow passage 92 communicates with both a port 182c of the check valve 79B and a pilot pressure port 181b of the check valve 78. When supply of a pressurized fluid is shut out from the flow passages 80, 92 (83), the pilot check valves (PVC) 78, 79B (79A) of this type shut the inner flow passages 181d, 182d, thereby preventing the pressurized fluids present in the first, second and fourth chambers A, B, D from flowing toward the flow passages 80, 92 (83). In this way, inner pressures of the first, second and fourth air chamber A, B, D are maintained as they are.

The shuttle valve (SHV) 110 is responsible for communicating one of two pipes 86, 91 at the input side with the pipe 92 at the output side. In the small chamber 110a of the shuttle valve (SHV) 110, a shuttle 111 is movably set. Pipes 86 and 91 are respectively arranged at both sides of the small chamber 110a so as to face each other. The pipe 92 is connected to the middle of the small chamber 110a. If air supplied from two pipes 86, 91 differs in pressure, the shuttle 111 is pushed from the pipe of a high-pressure side to the pipe of a low-pressure side, thereby allowing the communication between the high pressure pipe and the pipe 92. As a result, the air flows from the high pressure side to the pipe 92. As described, the shuttle valve (SHV) 110 is responsible for switching the flow passage by air pressure.

The regulator (REG) 83, which is a kind of pressure reduction apparatus, plays a role in reducing the supplied air slightly and outputting the reduced air.

Figure 16:
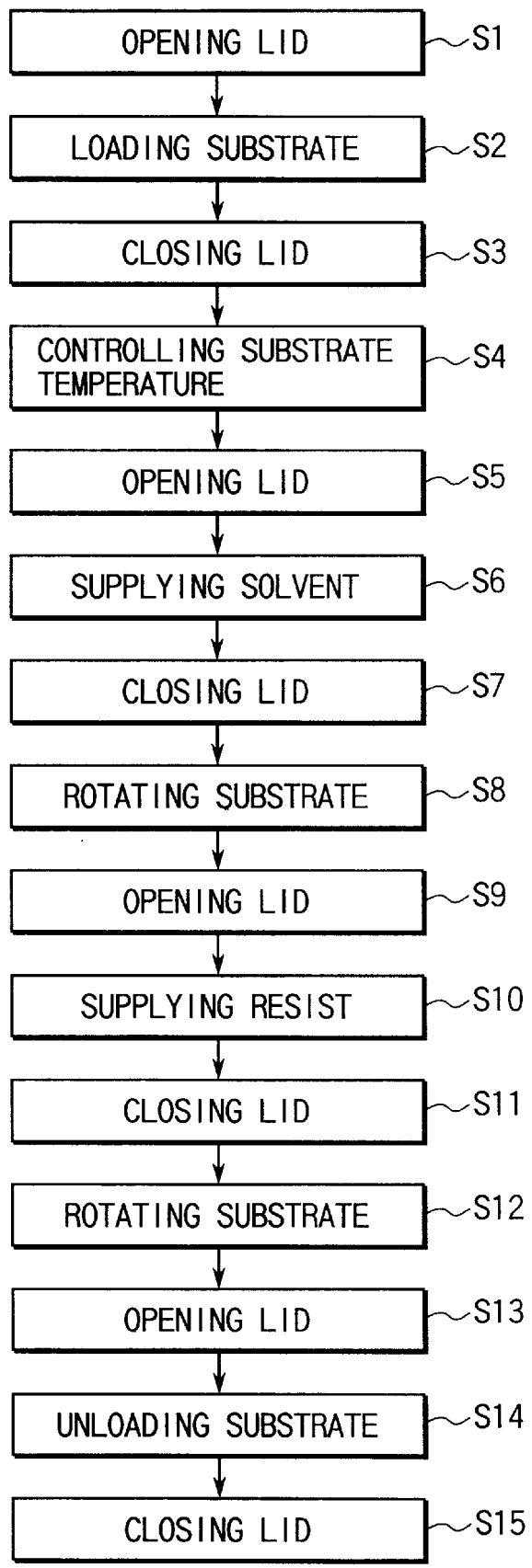
FIG. 16 is a flow chart showing a substrate processing method.

Next, referring to FIG. 16, a series of resist processing processes of the LCD substrate G will be explained.

A single substrate G is taken out form the cassette C1 by a sub-transfer arm 13. The substrate G is transferred from the sub transfer arm 13 to the first main transfer arm 14A. The first main transfer arm 14A transfers the substrate G from the brush washing unit 16, the adhesion unit 24 and the cooling unit 25 subsequently. In individual units, predetermined treatment is applied to the substrate G. After a series of predetermined treatments is completed, the first main transfer arm 14A transfers the substrate G to the second main transfer arm 14B. Furthermore, the second main transfer arm 14B transfers the substrate G to the unit 21. When the second main transfer arm 14B arrives in front of the resist coating section 21A, a shutter (not shown) is open to load the substrate G into a resist coating section 21A.

Subsequently, the lid 42 is opened by actuating the air cylinder mechanism 64 (Step 1). To open the lid 42, the solenoid valve (SOLV) 94 is first actuated to communicate the flow passage of the pipe 101 with the flow passage of the pipe 97. Since compressed air is supplied from an air supply source (air compressor) 202 to the pipe 101, the compressed air is supplied to the speed controller (SC) 89 by way of the solenoid valve (SOLV) 94. If the air supplied from the air compressor 202 has a pressure, for example, 4.5 kg/cm$^2$, the compressed air of 4.5 kg/cm$^2$ is also supplied to the pipe 85. Since the pipe 85 is branched off in the middle way toward the pipe 90, the air is divided into an air flow heading for the quick exhaust valve (QEV) 106 and an air flow heading for the regulator (REG) 103.

The compressed air heading for the quick exhaust valve (QEV) 106 is supplied to the fourth air chamber D of the second cylinder 64b by way of the quick exhaust valve 106, the pipe 83, the pilot check valve (PVC) 79A, the pipe 104, the speed controller (SC) 76 and the pipe 73. Hence, the pressure of the air supplied to the air chamber D is 4.5 kg/cm$^2$. This pressure serves as a force to lift up the second piston 68.

On the other hand, the air flow heading for the regulator (REG) 103 flows into the regulator (REG) 103 by way of the pipe 90. The air passing through the regulator (REG) 83 is reduced in pressure. For example, the air flowing from the pipe 90 at a pressure of 4.5 kg/cm$^2$ is reduced to 1.5 kg/cm$^2$ and flows out to the pipe 91. The air flowing into the pipe 91 is sent to the shuttle valve (SHV) 110. At this time, since no air is supplied into another input pipe 86 of the shuttle valve (SHV) 110 from the solenoid valve 93, the air applied to the shuttle 111 is that supplied from the pipe 91. The shuttle 111 is pushed by the air and moves within the small chamber 110a. As a result, the pipe 91 communicates with the pipe 92 and the air flows into the pipe 92. The air flowing into the pipe 92 is supplied into the second air chamber B positioned at the lower portion of the first cylinder mechanism 64a by way of the speed controller (SC) 75 and the pipe 72. Hence, the pressure of the air supplied to the second air chamber B is 1.5 kg/cm². This pressure serves as a force to lift up the first piston 66.

Note that the flow passage 70a is communicated with the third air chamber C (upper space of the second cylinder 64b) at the upstream and opened to air at the downstream by way of another flow passage (not shown). Furthermore, the flow passage 71a communicates with the first air chamber A (upper space of the first cylinder 64a) at the down stream and communicates with the solenoid valve (SOLV) 94 by way of the speed controller (SC) 74, the pilot check valve (PCV) 78, the quick exhaust. valve (QEV) 105 and the speed controller (SC) 88. The pipe 96 is connected to the pipe 102 of the exhaust-side at the solenoid valve (SOLV) 94. Since the airs of the first air chamber A and the third air chamber C are quickly exhausted by way of the aforementioned passage, the first and second pistons 66, 68 are swiftly lifted up.

Note that the inner flow passage 181d of the PCV 78 is opened by virtue of a pilot pressure of the pressurized fluid supplied through the flow passage 92.

As described, the second piston 68 is driven by the air of a pressure of 4.5 kg/cm² and the first piston 66 is driven by the air of a pressure of 1.5 kg/cm². The 4.5 kg/cm² air works to lift up the lid 42 in concert with the 1.5 kg/cm² air.

In this case, provided that the force due to the air of 4.5 kg/cm² in pressure for pushing up the second piston 68 is indicated by 4.5P, the force due to the air of 1.5 kg/cm² in pressure for pushing up the first piston 66 is indicated by 1.5P, and the pressure (force) required for lifting up the supply arm 61 and the lid 42 is indicated by W, the following relationship represented by inequality (1) is obtained $$1.5P < W < 4.5P \tag{1}$$

Therefore, the lid 42 stops after moved up by the stroke L3 of the second piston 68. In this case, the lid 42 moves up faster than the case of using the second cylinder 64b alone. Note that the second position PS2 is a position which can provide a space between the lid 42 and the cup CP, 41, sufficient for the holder 14b of the main arm mechanism to go in and out.

Note that when an instruction signal is sent from the controller 201 to each of machines provided in the circuit of the system 200, operation of each of machines is interlocked upon receipt of the signal. Therefore, the lid 42 stops at the second position PS2. In addition, the lifting operation of the lid 42 is mechanically limited also by the presence of the shock absorber 190C. Hence, the lid 42 cannot be moved up over the second position PS2. Before the loading/unloading operation is initiated, the output from the sensor is checked. In the case where abnormality is found, the controller 201 actuates an alarm system 204; at the same time, immediately terminates the air supply and the exhaust operation. when the abnormality takes place, the substrate under processing in other processing section is at least completed and the processing operation is continuously performed as much as possible. On the other hand, the unprocessed substrate is temporarily stored in a vacant space of the buffer cassette or processed in another processing apparatus in the case where the coating apparatus consists of a plurality of apparatuses.

When the cover 42 stops at the second position PS2, the spin chuck 43 is moved up to transfer the substrate G from the arm holder 14b to the spin chuck 43. The arm holder 14b is allowed to withdraw, and then, the shutter is closed. The spin chuck 43 is moved down while absorbing and holding the substrate G by the spin chuck 43 (Step S2).

Figure 18:
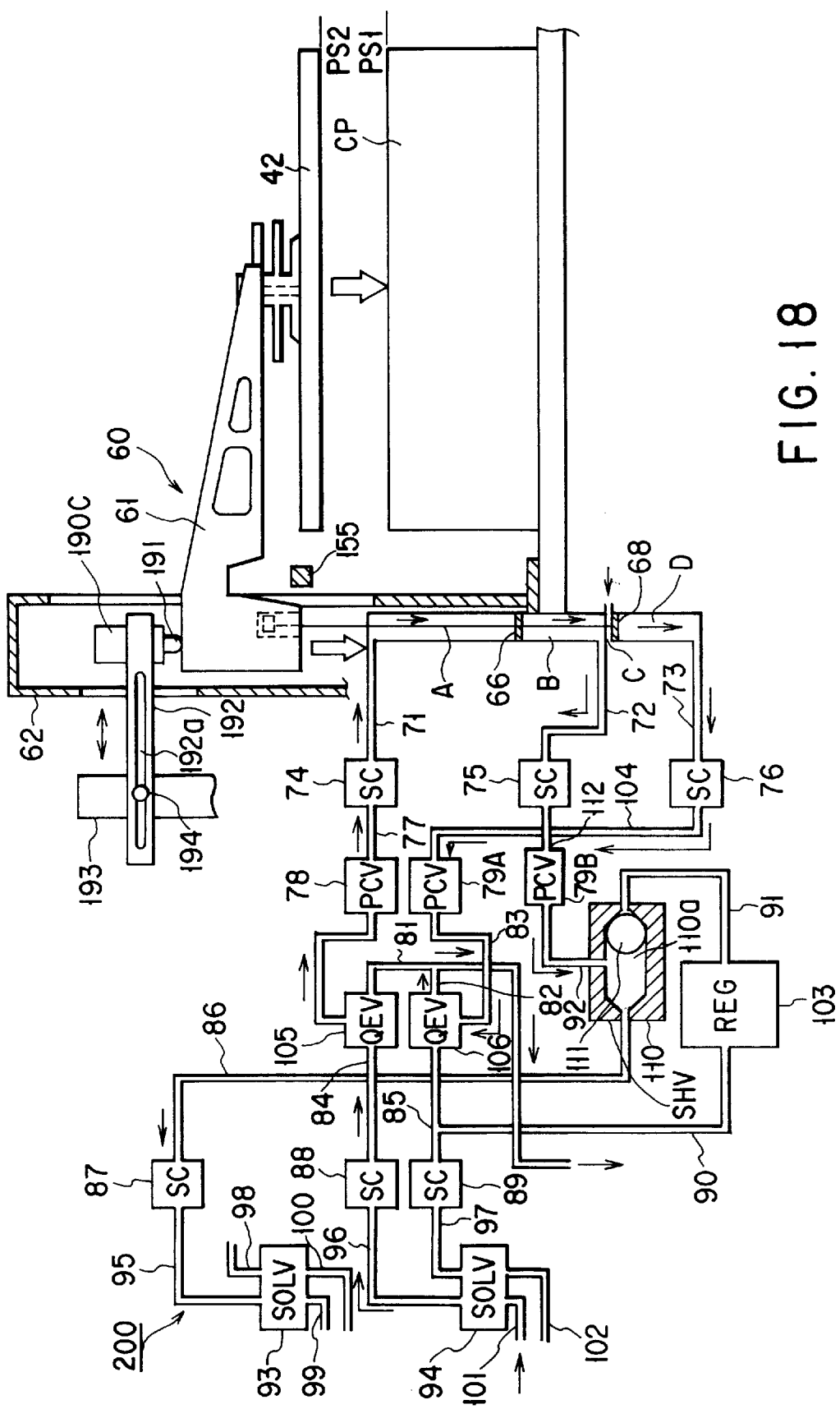
FIG. 18 is a block circuit diagram showing how to close the lid in a substrate processing apparatus according to an embodiment of the present invention.

Air is supplied to the first air chamber A of the air cylinder mechanism 64 to move down the first piston 66; at the same time, air is supplied to the third air chamber C to move down the second piston 68. Then, the cup is covered by the lid 42, as shown in FIG. 18 (Step S3).

Now, how to close the lid 42 will be explained.

First, operation of the solenoid valve (SOLV) 94 is switched. More specifically, the communication between the pipe 97 and the supply pipe 101 is changed to the communication between the pipe 97 and the exhaust pipe 102. Since no air is supplied from the pipe 101, the weight of the support arm 61 and the lid 42 is applied downwardly onto the second piston 68 via the first piston 66. As a result, the first piston no longer supports the support arm 61 and the lid 42 and starts descending. Then, the air within the fourth air chamber D is sent to the quick exhaust valve (QEV) 106 by way of the pipe 73, the speed controller (SC) 76, the pipe 104, the pilot check valve (PCV) 79A, and the pipe 83. The flow passage of the quick exhaust valve (QEV) 106 communicates with the pipe 82, exhausting the air toward the pipe 82. Since the pipe 82 is wide in diameter, air is swiftly exhausted from the fourth air chamber D, with the result that the second piston 68 moves down quickly.

At this time, the inner flow passage 182d of the PVC 79A is opened by virtue of the pressurized fluid supplied through the flow passage 80.

On the other hand, when the air supplied to the fourth air chamber D from the pipe 101 is terminated, the first piston 66 of the first cylinder 64a is no longer lifted up. The weight of the support arm 61 and the lid 42 is applied onto the first piston 66. Hence, the air of the second air chamber B is introduced into the shuttle valve (SHV) 110 by way of the pipe 72, the speed controller (SC) 75, a pilot check valve (PCV) 79B and the pipe 92, and further introduced into the pipe 85 by way of the pipe 91, the regulator (REG) 103, and the pipe 90. Since the air introduced into the pipe 85 is sent to the pipe 82 by way of the quick exhaust valve (QEV) 106 in the similar manner, with the result that evacuation is swiftly made through the pipe 82. As a result, the first piston 66 moves down quickly. At this time, the inner flow passage 182d of the PVC 79B is opened by virtue of the pressurized fluid supplied through the flow passage 80.

When the support arm 61 moves down to the lowest position, the lower surface of the support arm 61 comes into contact with the shock absorber 190B. The damper of the shock absorber 190B is slightly and upwardly urged from the descending and stopping position. When the weight of the lid 42 and the support arm 61 is applied to the damper, the shock absorber attached to the lower portion of the damper is distorted. As a result, the descending speed of the lid 42 becomes slow and therefore the lid 42 is moved down slowly and fixed at the cup CP. Since the descending speed of the lid 42 is reduced as mentioned, the lid 42 does not damage the cup CP.

After the lid 42 is closed, the temperature of the substrate G placed within the closed cup CP is controlled (Step 4). After the temperature control is completed, the lid 42 is opened (Step S5) and the arm 155 is rotated to position the nozzle 157 immediately above the center of the substrate G. While rotating the substrate G at low speed, a solvent is supplied (Step S6) to the substrate G from the nozzle 157 (Step S6). The lid 42 is closed (Step S7) and the substrate G and the cup 41 are synchronously rotated to disperse the solvent over the surface of the substrate G (Step S8). Since the substrate G and the cup are rotated synchronously, substantially no air flow is generated around the substrate G, the temperature of the solvent is equalized.

The lid 42 is opened (Step S9), the nozzle 157 is set right above the center of the substrate G, and a resist solution is supplied to the substrate G from the nozzle 157 (Step S10). Then, the lid 42 is closed (Step Sll), evacuation of the drain cup 41 is started. Simultaneously, the substrate G is rotated in synchronism with the cup CP to disperse the resist solution over the surface of the substrate G (Step S12).

The lid is opened (Step S13) and the spin chuck 43 is moved up to transfer the substrate G onto the transfer mechanism 262. The transfer mechanism 262 unloads the substrate G from the resist coating section 21A and transfers it toward the peripheral coating film removing section 21B (Step S14). After the transfer mechanism 262 is withdrawn, the spin chuck 43 is moved down and the lid 42 is closed (Step S15).

In the peripheral coating film removing section 21B, the table 230 is moved down to transfer the substrate G from the transfer mechanism 262 onto the table 230. The transfer mechanism 262 is withdrawn and the table 230 is moved down. While moving the nozzles 234 along the corresponding sides of the substrate G, the resist coating film is removed from the peripheral portion of the substrate G. Then, the table 230 is moved up and the substrate G is taken up from the table 230 by the second main transfer arm mechanism 14B to unload it from the unit 21.

Thereafter, the substrate G is transferred to the baking unit 26 and the cooling unit 27 by the second and third main transfer arms 14B and 14C. Predetermined treatments are performed in the units 26, 27. Furthermore, the substrate G is loaded by the third main transfer arm 14C into the light-exposure apparatus 6 via the interface section 7 in order to patternexpose the resist coating film by the light exposure apparatus 6.

After light exposure treatment, the substrate G is transported to the development unit 28 to develop the pattern-exposed resist film. Furthermore, the substrate G is rinsed with pure water and dried up with heat. The substrate G is further transported to the cooling unit 33 to cool it. The processed substrate G is transferred to the first to third main transfer arms 14A, 14B, 14C and the sub transfer arm 13. The substrate G is placed into the cassette C2 of the loader section 2 by the sub transfer arm 13. Finally, the cassette 2 storing the substrates G is unloaded from the system 1. The processed substrate G is transported to another processing apparatus used in a next step.

Next, referring to FIGS. 11, 19, 20, how to perform the maintenance operation of the aforementioned apparatus will be explained.

In the resist coating section 21A, the resist solution is scattered and attached onto individual portions such as the cup CP 41 to stain them. Therefore, if the resist coating section 21A is operated continuously for a long time, it may be better to clean every portion of the apparatus. At the time of maintenance operation, members must be removed from the main apparatus. The removing operation is disturbed by the lid 42. It is therefore necessary to ensure a sufficient operational space at the upper portion of the main apparatus.

First, the shock absorber 190C is removed from the guide post 62. The solenoid valve (SOLV) 94 is actuated to communicate the pipe 101 with the pipe 97. In this manner, the air of 4.5 kg/cm² in pressure is sent to the pipe 97 and the fourth air chamber D, and the air of 1.5 kg/cm² in pressure, which has been reduced by the regulator (REG) 103, is sent to the second air chamber B. In this way, the lid 42 is moved up to the third position PS3.

Subsequently, the solenoid valve (SOLV) 93 is actuated to communicate the pipe 99 and the pipe 95 to thereby supply the air of 4.5 kg/cm² in pressure to the pipe 95. The air is introduced into the shuttle valve (SHV) 110 by way of the speed controller (SC) 87 and the pipe 86. Since the air as high a pressure as 4.5 kg/cm² is supplied from the pipe 86 to the shuttle valve (SHV) 110 where the air of 1.5 kg/cm² has been supplied from the pipe 91, the shuttle 111 is pushed to a lower pressure side, i.e., the pipe 91 side within the shuttle valve (SHV) 110, by the newly supplied air of 4.5 kg/cm². As a result, the pipe 86 communicates with the pipe 92. Consequently, the air of 4.5 kg/cm² flows into the pipe 92 and further goes into the second air chamber B by way of the speed controller (SC) 75 and the pipe 72. Hence, a driving force working vertically and upwardly is applied to the piston 66 due to the air of 4.5 kg/cm².

As mentioned above, since there is a relationship:

$$1.5P < W < 4.5P$$

the lid 42 and the support arm 61 are lifted up by the force of the air. As shown in FIG. 19, the lid 42 is moved up to the third position PS3 and maintained as it is. Note that the first piston 66 moves up independently of the second rod 67, as shown in FIG. 11.

As explained, the maintenance operation is performed while maintaining the lid 42 at the highest position to be attained. The lid 42 is moved down after completion of the maintenance operation.

Now, how to descend the lid 42 will be explained.

First, operation of the solenoid valve (SOLV) 93 is switched to communicate the pipe 95 with the pipe 100 of the exhaust side. Since no air is supplied from the pipe 99, the driving force working vertically and upwardly is no longer applied to the first piston 66. The weight of the lid 42 and the support arm 61 is applied downwardly. Due to this weight, the first piston 66 is moved down. The air of the second air chamber B therefore flows into the shuttle valve (SHV) 110 by way of the pipe 72, the speed controller (SC) 75 and the pipe 92. Since the shuttle 111 is placed at the pipe 91 side within the shuttle valve (SHV) 110, the air flows into the pipe 86 and arrives at the solenoid valve (SOLV) 93 by way of the speed controller (SC) 87 and the pipe 95. In the solenoid valve (SOLV) 93, since the pipe 95 communicates with the exhaust pipe 100, the air is exhausted through the exhaust pipe 100. As a result, the first piston 66 moves down and the bottom of the piston 66 comes into contact with the second rod 67.

Prior to this, the solenoid valve (SOLV) 94 plays a role in communicating the pipe 97 with the exhaust valve 102 in synchronism with the solenoid valve (SOLV) 93. Therefore, the air supply from the pipe 101 to the fourth air chamber D, is stopped. Since the force driving the second piston 68 upwardly is no longer applied, the second piston 68 starts descending due to the force of the second piston 68 upon descending the first piston 66.

As a result, the inner air of the fourth air chamber D flows into the pipe 73 and further introduced into the quick exhaust valve 106 by way of the speed controller (SC) 76, the pipe 104, the pilot check valve (PVC) 79A and the pipe 83. In the quick exhaust valve 106, the pipe 83 communicates with the pipe 82, so that the air flowing into the quick exhaust valve (QEV) 106 is introduced into the pipe 82 and swiftly exhausted through the pipe 82. Since the air within the fourth air chamber D is swiftly exhausted through the pipe 82, the lid 42 can be moved down quickly.

In case of the power supply is shut out and thereby the air supply is terminated, the air supply to the second air chamber B is still maintained by virtue of the PCV 79B (that is, the air is shut in the second air chamber), so that the lid 42 is not moved down.

According to the aforementioned embodiment, it is possible to change the height of the lid 42 lifted during the substrate processing time and the maintenance operation time. Hence, the maintenance operation can be performed simply and securely without taking the apparatus apart.

According to he aforementioned embodiment, the lid 42 can be raised at high speed and thereby operated smoothly.

Furthermore, in the case of descending the lid 42, the air is exhausted through the quick exhaust valves (QEV) 105, 106 at high speed, with the result that air can be exhausted from the air cylinder 64 quickly. Hence, the lid 42 can be moved down at high speed and closed securely.

In the aforementioned embodiment, the coating apparatus for coating resist on the LCD substrate has been explained. However, any apparatus can be used as long as it is a substrate processing apparatus with a lid. Hence, the present invention can be applied to other apparatuses including a developing apparatus. The present invention can be further applied to an apparatus for coating a resist solution onto the semiconductor wafer and developing the coated resist.

Furthermore, in the aforementioned embodiment, the cylinders 64a, 64b are moved by supplying air to the second air chamber B and the fourth air chamber D positioned at the lower portions of the cylinders 64a, 64b, respectively. However, the cylinders 64a, 64b may be moved by applying a negative pressure simultaneously to the first air chamber A and the third air chamber C at the upper portions of the cylinders 64a, 64b.

Furthermore, in the general manufacturing step mentioned above, the lid 42 may be moved up by use of the air supply in combination with the application of the negative pressure and moved down by use of natural exhaustion in combination with the application of the positive pressure.

Furthermore, the present invention is not limited to the aforementioned embodiments. The first lifting mechanism and the second lifting mechanism are arranged in parallel and the support arm 61 may be lifted by either the first lifting mechanism or the second lifting mechanism. In this case, an inner diameter of the cylinder of the first lifting mechanism may be set differently from that of the cylinder of the second lifting mechanism.

Next, referring to FIGS. 21–24, the substrate processing apparatus according to another embodiment will be explained. Note that detailed explanation will be omitted for the portions of this embodiment overlapping with the aforementioned embodiment.

Figure 21:
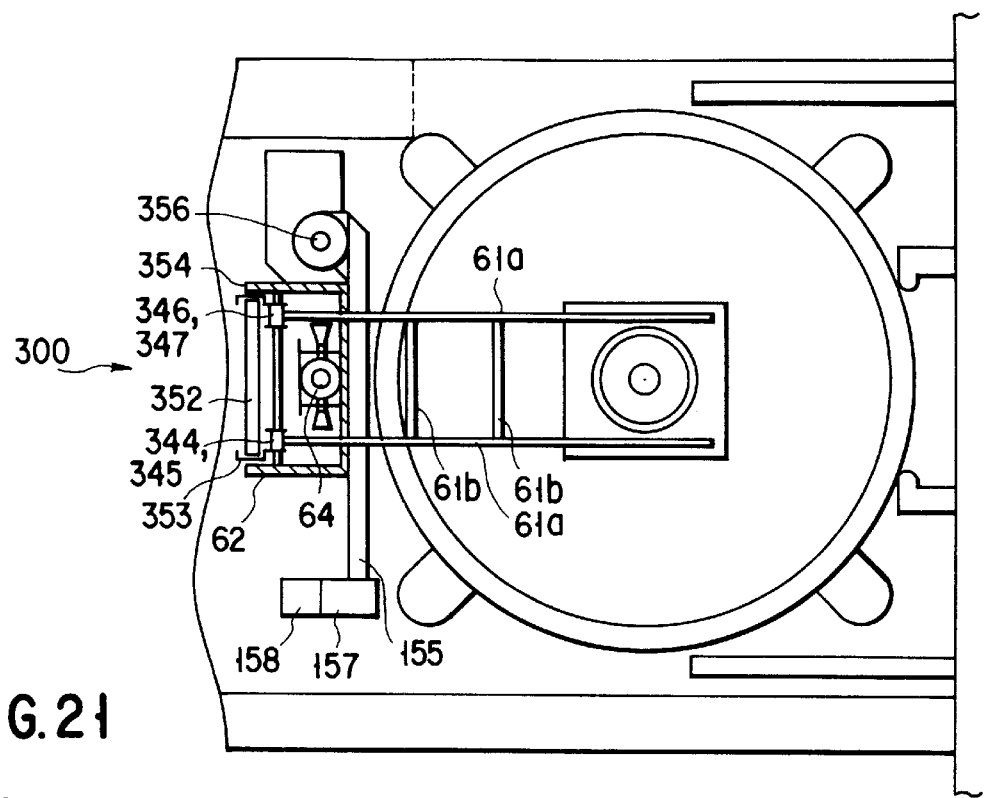
FIG. 21 is a plan view of a substrate processing apparatus according to another embodiment of the present invention.
Figure 22:
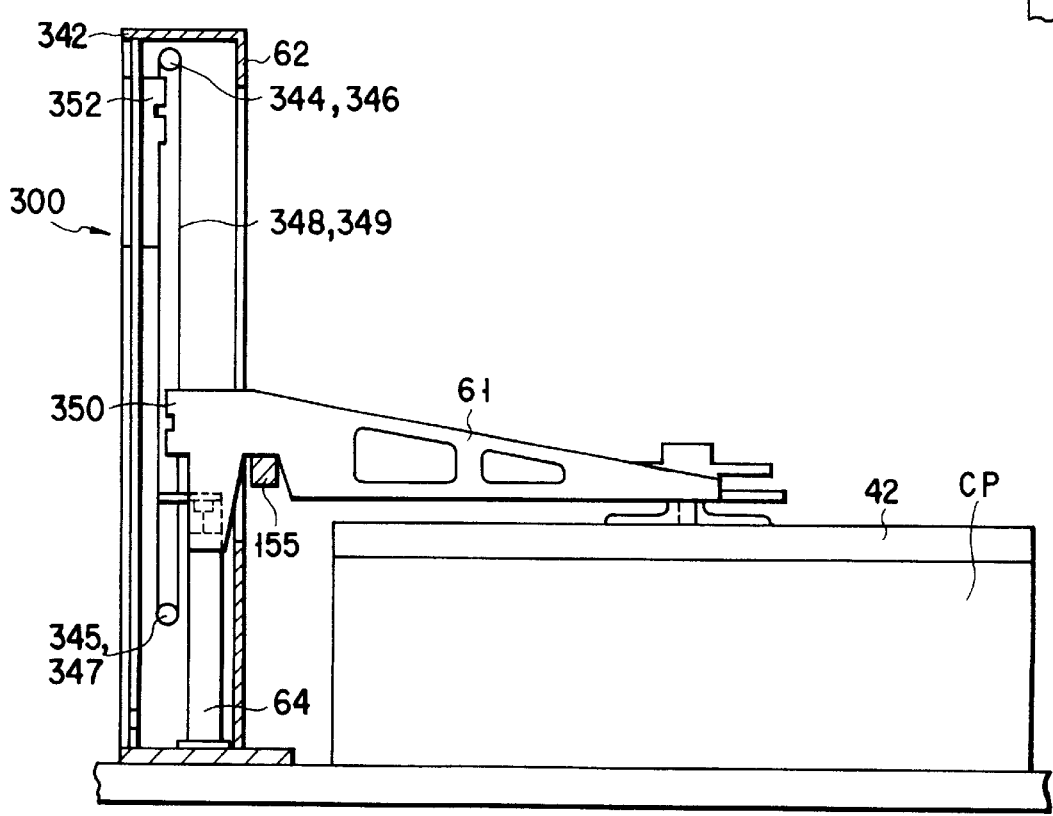
FIG. 22 is a partial plan view of a substrate processing apparatus according to another embodiment of the present invention.
Figure 23:
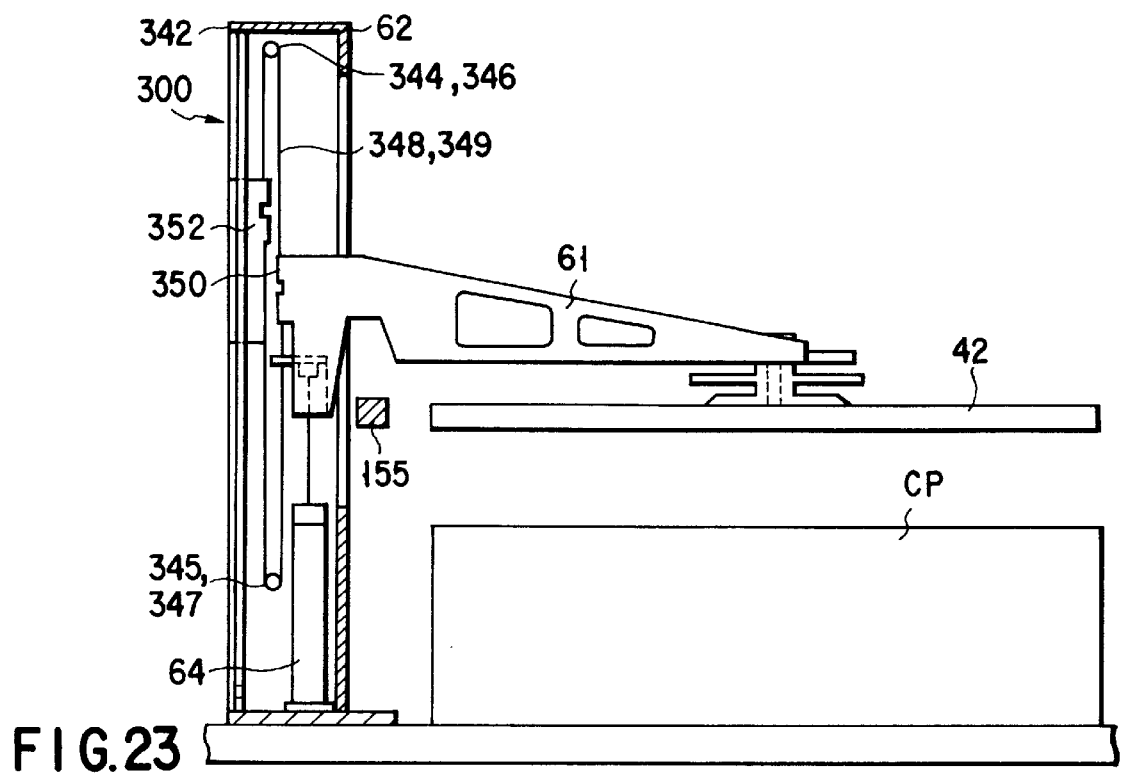
FIG. 23 is a partial plan view of a substrate processing apparatus according to another embodiment of the present invention.
Figure 24:
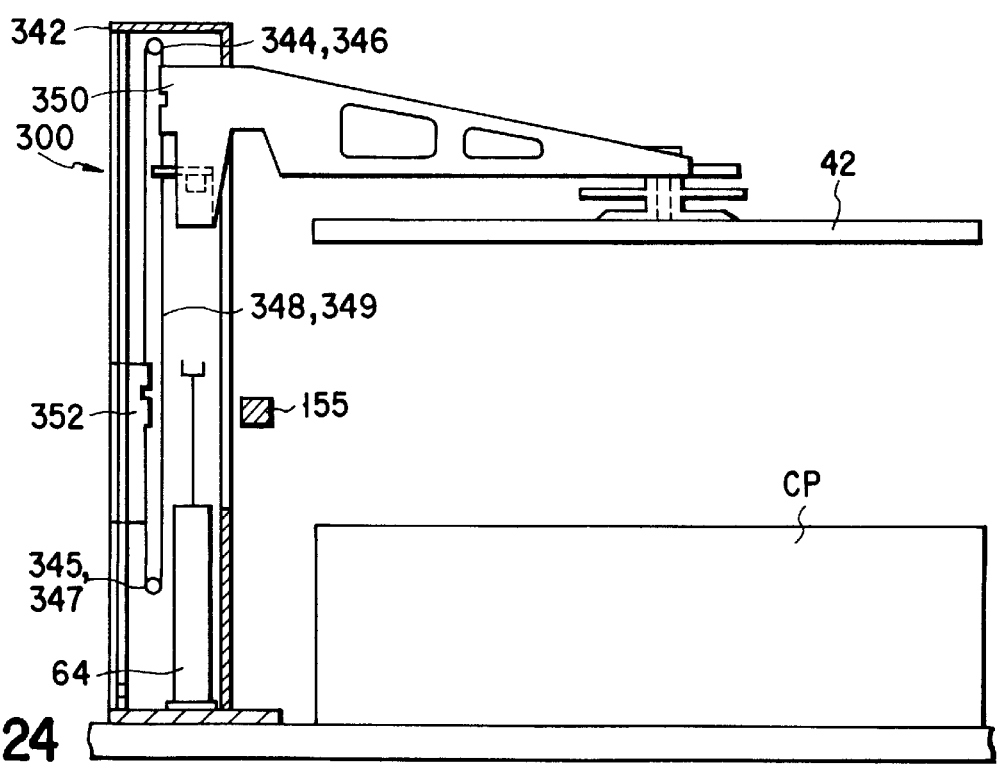
FIG. 24 is a partial plan view of a substrate processing apparatus according to another embodiment of the present invention.

As shown in FIG. 21, an auxiliary lifting mechanism 300 is provided in parallel to the air cylinder mechanism 64 in the guide post 62. The auxiliary lifting mechanism 300 has two pulleys in each of the upper and lower portions. More specifically, four pulleys, 344, 345, 346, and 347 are provided in total. The second pulley 345 is arranged immediately bellow the first pulley 344. The fourth pulley 347 is arranged immediately below the third pulley 346. A belt 348 is stretched between the first and second pulleys and a belt 349 is stretched between the third and fourth pulleys. To one end of each of the two belts 348 and 349, a root portion 61c of the support arm 61 is fastened by a fastening member 350.

To the other end of each of the two belts 348, 349, a weight 352 is attached. The weight 352 serves as a balancer to keep the balance between the weight of the support arm 61 and the lid 42, When the support arm 61 is positioned at the lowest point, the weight 352 is positioned at the highest point. The weight 352 is liftably guided along the guide rails 353, 354. When the support arm 61 is moved down, the weight 352 is raised. On the contrary, when the support arm 61 is lifted up, the weight 352 moves down.

Note that the upper pulleys 342, 344 are arranged at positions higher than the air cylinder mechanism 64. The weight 352 may be heavier than the total weight of the lid 42 and the support arm 61.

According to the present invention, it is possible to perform the maintenance operation simply and securely without taking the apparatus apart. In addition, according to the present invention, it is possible to move up and down the lid swiftly during the substrate processing time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate holding apparatus for holding a substrate to be subject to photolithographic processing, said substrate holding apparatus comprising:

a substrate mounting table;

a cup having an upper opening and surrounding the substrate mounting table;

a lid for opening/closing the upper opening of the cup;

a support arm for supporting the lid;

a first lifting mechanism having a first piston for supporting the support arm directly or indirectly and a first cylinder for guiding the first piston in an up-and-down motion;

a second lifting mechanism having a second piston for supporting the support arm and a second cylinder for guiding the second piston in up-and-down motion, said second piston supporting the support arm indirectly at least via the first piston;

a driving circuit configured to independently supply pressurized fluid to the first and second cylinders and to independently exhaust the pressurized fluid from the first and second cylinders; and a control mechanism for controlling operations of the driving circuit.

2. The apparatus according to claim 1, wherein said control mechanism controls operation of the driving circuit by selecting either a case where the lid moves up and down together with the support arm by means of the first and second lifting mechanisms or a case where the lid moves up and down together with the support arm by either the first lifting mechanism or the second lifting mechanism.

3. The apparatus according to claim 1, wherein said control mechanism controls operation of the driving circuit so as to move the lid up and down together with the support arm by means of both of the first and second lifting mechanisms.

4. The apparatus according to claim 3, wherein said control mechanism controls the driving circuit in such a way that a driving force smaller than that required for moving the lid up together with the support arm, is applied to either the first piston or the second piston.

5. The apparatus according to claim 1, wherein a stroke of the first piston differs from that of the second piston.

6. The apparatus according to claim 1, wherein a stroke of the first piston is larger than that of the second piston and the lid is lifted up to a height which provides a sufficient space for maintenance operation between the cup and the lid when the first and second pistons are moved up to an upper dead point.

7. The apparatus according to claim 1, wherein said support arm comprises two arm members for supporting the lid at one of sides of the lid.

8. The apparatus according to claim 1, further comprising an alarm configured to give an alarm upon receiving a signal from the control mechanism when abnormal up-and-down operation of the lid takes place.

9. The apparatus according to claim 1, further comprising, a check valve included in said driving circuit, wherein said check valve communicates with at least one of the first and second cylinders and is configured to prevent leakage of the pressurized fluid from at least one of the first and second cylinders.

* * * * *